US008352695B2

(12) United States Patent
Klein et al.

(10) Patent No.: US 8,352,695 B2
(45) Date of Patent: Jan. 8, 2013

(54) SELECTABLE ACCESS RATES IN A MEMORY AND MEMORY COMMUNICATION SYSTEM

(75) Inventors: Christian Klein, Unterhaching (DE); Stefan Linz, Sauerlach (DE); Helmut Reinig, Isen (DE)

(73) Assignee: Lantiq Deutschland GmbH, Neubiberg (DE)

( * ) Notice: Subject to any disclaimer, the term of this patent is extended or adjusted under 35 U.S.C. 154(b) by 400 days.

(21) Appl. No.: 11/754,854

(22) Filed: May 29, 2007

(65) Prior Publication Data

US 2007/0283077 A1 Dec. 6, 2007

(30) Foreign Application Priority Data

May 30, 2006 (DE) .......................... 10 2006 025 133

(51) Int. Cl.
*G06F 13/14* (2006.01)
(52) U.S. Cl. ........... 711/167; 711/149; 710/62; 710/315
(58) Field of Classification Search .................. 711/149, 711/467, 170, 167; 709/233; 710/25, 62, 710/315
See application file for complete search history.

(56) References Cited

U.S. PATENT DOCUMENTS

| | | | |
|---|---|---|---|
| 5,253,348 A | 10/1993 | Scalise | |
| 5,838,684 A | 11/1998 | Wicki et al. | |
| 5,928,347 A * | 7/1999 | Jones | 710/305 |
| 5,935,232 A | 8/1999 | Lambrecht et al. | |
| 6,247,104 B1 * | 6/2001 | Suzuki | 711/167 |
| 6,330,623 B1 * | 12/2001 | Wu et al. | 710/23 |
| 6,493,803 B1 * | 12/2002 | Pham et al. | 711/147 |
| 6,504,854 B1 * | 1/2003 | Hofmann et al. | 370/518 |
| 6,804,197 B1 * | 10/2004 | Henry et al. | 370/230.1 |
| 6,882,082 B2 * | 4/2005 | Greeff et al. | 310/307 |
| 6,938,119 B2 | 8/2005 | Kohn et al. | |
| 6,973,516 B1 * | 12/2005 | Athanas et al. | 710/100 |
| 6,985,181 B2 * | 1/2006 | Ewedemi et al. | 348/294 |
| 7,180,972 B1 * | 2/2007 | Venkata et al. | 375/371 |
| 7,190,754 B1 * | 3/2007 | Chang et al. | 375/373 |
| 7,409,477 B2 * | 8/2008 | Wyatt et al. | 710/62 |
| 2001/0011356 A1 * | 8/2001 | Lee et al. | 713/322 |
| 2001/0014924 A1 * | 8/2001 | Nishihara | 710/52 |
| 2003/0009612 A1 * | 1/2003 | Latta | 710/240 |
| 2003/0159081 A1 * | 8/2003 | MacLellan et al. | 713/600 |
| 2004/0151209 A1 * | 8/2004 | Cummings et al. | 370/503 |
| 2004/0216018 A1 * | 10/2004 | Cheung | 714/724 |
| 2004/0258058 A1 * | 12/2004 | Heston et al. | 370/389 |
| 2005/0021874 A1 * | 1/2005 | Georgiou et al. | 709/250 |
| 2005/0060469 A1 * | 3/2005 | Feng et al. | 710/305 |
| 2005/0083902 A1 | 4/2005 | Hashimoto | |
| 2005/0149651 A1 * | 7/2005 | Doak et al. | 710/52 |
| 2005/0169304 A1 * | 8/2005 | Murata | 370/466 |
| 2005/0172058 A1 * | 8/2005 | Brown et al. | 710/105 |
| 2005/0175077 A1 * | 8/2005 | Lee | 375/222 |
| 2005/0210177 A1 * | 9/2005 | Norden | 710/317 |
| 2005/0246340 A1 * | 11/2005 | Smith | 707/9 |

(Continued)

FOREIGN PATENT DOCUMENTS

EP 1 531 397 A1 5/2005

(Continued)

*Primary Examiner* — Hal Schnee
(74) *Attorney, Agent, or Firm* — Slater & Matsil, L.L.P.

(57) ABSTRACT

A memory system includes a selection element for selecting a selectable access rate from a plurality of access rates and a memory element for providing or for accepting data at the selectable access rate.

23 Claims, 8 Drawing Sheets

U.S. PATENT DOCUMENTS

| | | | |
|---|---|---|---|
| 2006/0043202 A1* | 3/2006 | Kim et al. | 235/492 |
| 2006/0044927 A1* | 3/2006 | Han et al. | 365/232 |
| 2007/0033327 A1* | 2/2007 | Sinclair | 711/103 |
| 2007/0073915 A1* | 3/2007 | Go et al. | 710/11 |
| 2007/0113123 A1* | 5/2007 | Crouch et al. | 714/724 |
| 2007/0121389 A1* | 5/2007 | Wu et al. | 365/189.05 |
| 2007/0183179 A1* | 8/2007 | Maeda et al. | 365/52 |
| 2007/0183192 A1* | 8/2007 | Barnum et al. | 365/180 |
| 2007/0266179 A1* | 11/2007 | Chavan et al. | 709/250 |

FOREIGN PATENT DOCUMENTS

| | | |
|---|---|---|
| WO | WO 97/31462 | 8/1997 |
| WO | WO 2004/070781 A2 | 8/2004 |

* cited by examiner

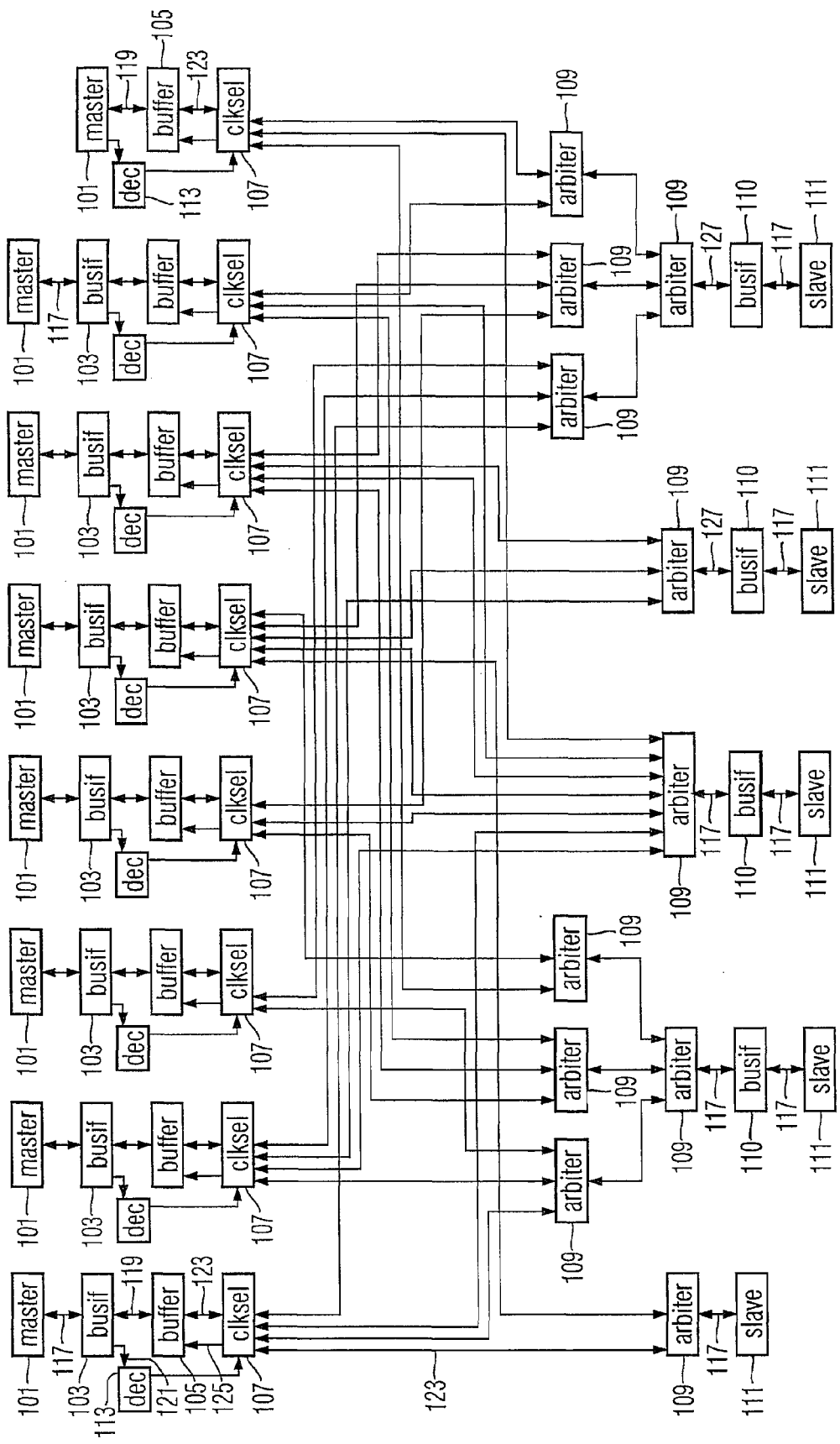

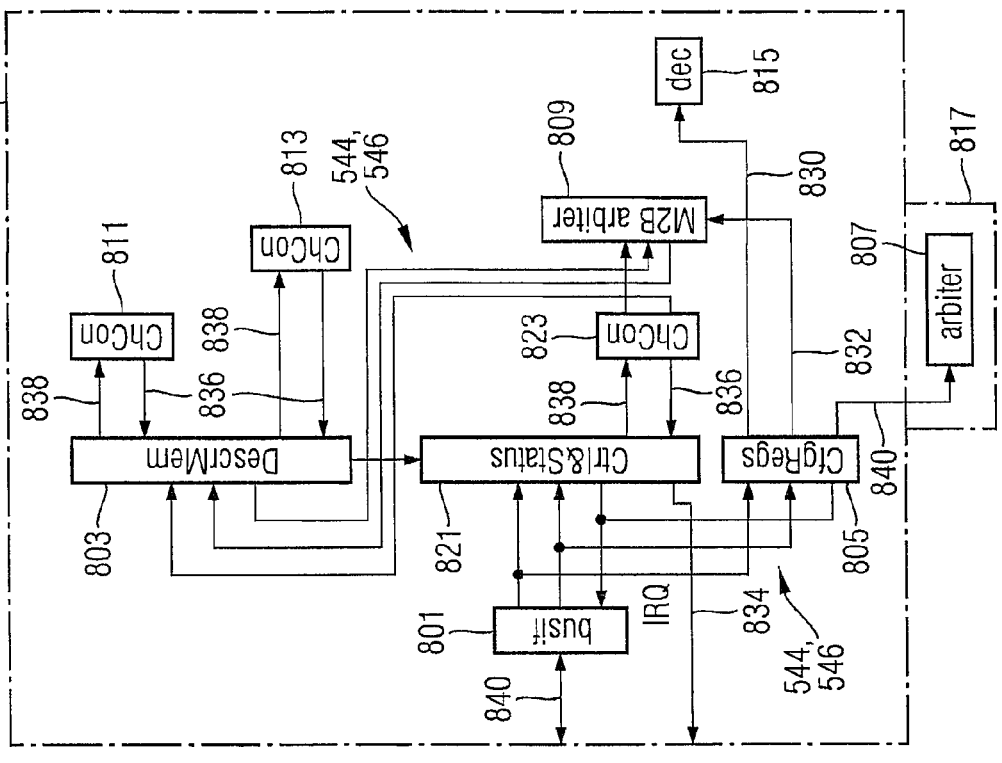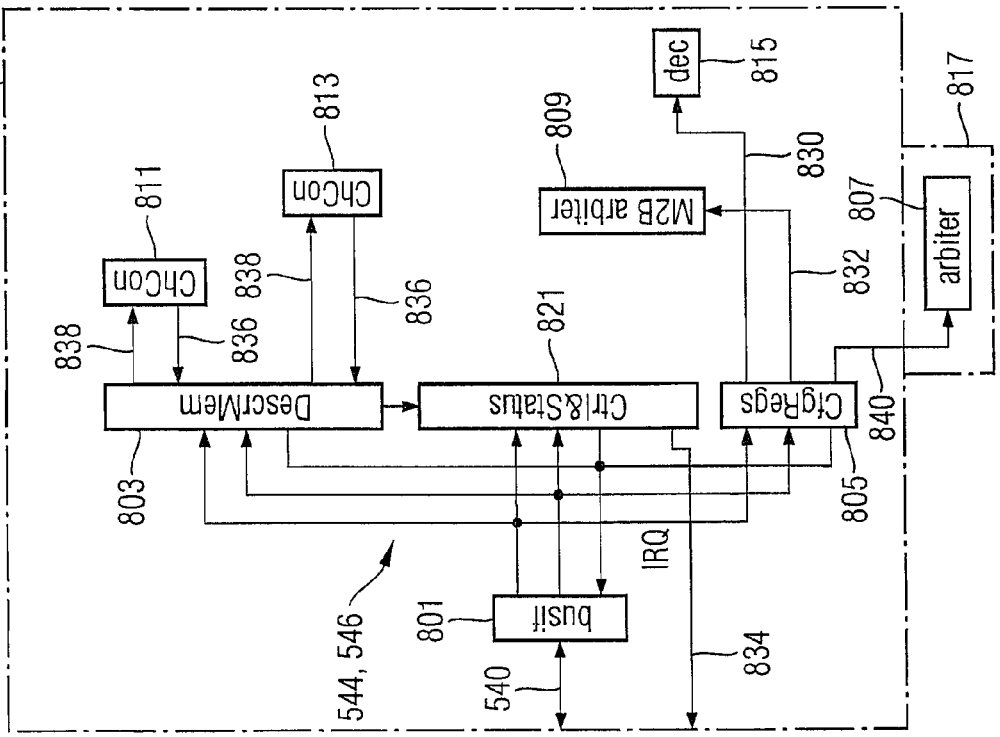

SELECTABLE ACCESS RATES IN A MEMORY AND MEMORY COMMUNICATION SYSTEM

This application claims priority to German Patent Application 10 2006 025 133.4 which was filed May 30, 2006, and is incorporated herein by reference.

TECHNICAL FIELD

The present invention relates to memory systems for providing or accepting data and to memory communication systems.

BACKGROUND

In the design of digital circuits, particularly in the design of digital circuits with so-called systems on a chip (SOC), a number of components must be connected to one another. These components can be divided into master and slave units. Masters are generators of transactions which cause a data transfer, and slaves are consumers of transactions. The data flow itself can take place in two directions: from a master to a slave (write transaction) and from a slave to a master (read transaction). The components which are to be connected to one another can also be, at the same time both master and slaves, by introducing more than one interface type.

A communication system arranged between a master and a slave should enable a number of masters to communicate simultaneously in a non-blocking way with multiple slaves. The different interface types within the same components and/or within different components can be operated at the same clock rate, at clock rates dependent on one another or at completely independent asynchronous clock rates. The last case mentioned is the most difficult one to handle with a total of M master interfaces which communicate with a number S of slave interfaces.

The simplest solution to the communication problem mentioned above consists of providing an independent communication path from each master to each slave with which the master is to communicate and to arrange memories with grey-coded read and write pointers on each communication path. The memories (buffers) synchronous the transaction codes, the write data and the read data between the clock domains of a master and of a slave. The solution meets the following criteria: a short latency period of an individual buffer between a master and a slave, high throughput because independent communication channels provide for non-blocking parallel communication; independent clock relations between each master and each slave so that changes in a clock rate of an individual module do not have any effects on the interconnection. One disadvantageous of this concept consists in that the silicon area increases greatly for larger systems because M×S buffers are needed. If, for example, the buffers need to accommodate 32-bit wide data words and burst sizes of 8 words, this concept leads to a significant consumption of area.

Another solution of the above-mentioned problem improves the utilization of silicon area by using a two-stage clock domain cross-over: firstly, each master uses one or more buffers for a translation to a crossbar network. At the end of the network, another storage element is used for changing into the clock domain of the slave. This requires M+S instead of M×S buffers which means a significant reduction for greater numbers of masters and slaves. However, the latency is higher since two buffers must be passed through on each path from each master to a slave. The throughput is the same because the crossbar provides for non-blocking communication from each master to each slave. Furthermore, a flexibility of clock rates for master and slaves is given due to private buffers for each master and slave which enables each clock domain to be bridged without adversely affecting other components.

For a routing application, where the data flow from the masters to the slaves is unidirectional, even smaller interconnect schemes are known. The transaction code is extracted from a header of a data packet which is sent in frames. The transaction code comprises at least the destination address and the number of data units to be transmitted. The data units follow the payload of the packet. For each master, one buffer is provided for accepting the input packet. The destination address is used for determining the output port to a slave. Since a plurality of masters may wish to communicate with the same slave simultaneously, an arbitration mechanism provided for each slave decides which of the masters is really connected at a given time. The connections themselves can be provided by a crossbar structure. The buffers can enable the different clock domains between a master and a slave to be bridged. The interconnect structure reduces the number of buffers to M. The latency is also reduced to the latency of a single buffer between a master and a slave. The throughput is the same as in the other known concepts due to the non-blocking crossbar.

A further problem which occurs when designing digital circuits with the systems-on-a-chip as mentioned above is that interfaces or internal accelerators need a data transfer between one another and, for example, to and from a memory at high data rates. It is not practical to transmit data at high data rates by using a CPU which copies the data because a CPU must first write the data into an internal register before it can forward the data to another destination. For this reason, components with high data rates are usually connected to a DMA (Direct Memory Access). At the least, this enables components with high data rates to access a memory for a relatively long time independent of a CPU, the source and destination addresses having to be reconfigured from time to time by the CPU. This feature is called peripheral-to-memory copy and memory-to-peripheral copy because the memory access can occur in both directions. This also enables direct copying between two components without intermediate storage in a memory (peripheral-to-peripheral copy). It is also makes it possible to implement a memory-to-memory copy.

There are two possibilities for a DMA implementation: decentralized DMA and centralized DMA. The decentralized DMA requires that each component has an inbuilt bus-master capability so that it (or other components) can independently access a memory. The centralized DMA can form an interface to components with simple slave interfaces by working as a master for the memory interfaces for carrying out data transmissions to these components, and by operating as a master for the memory interfaces. A DMA controller of a central DMA can be coupled to all components by using a single interface or by using a number of interfaces. The more interfaces that are used, the higher data rates are achieved and the more independence can be theoretically provided in the clock domains since a single interface requires all components to be operated in the same clock domain. The design of a central DMA architecture for different SOC designs is complicated for the following three reasons:

1. The components which are to be connected to a central DMA unit usually have interfaces of different origin: some are older in-house modules, some are procured from different IP equippers at different times. In the worst case, each of the components to be connected can have different types of a slave interface. A central DMA unit should therefore be capable of handling master tasks for a plurality of interfaces.
2. Each component connected to the central DMA unit should be capable of operating at the clock speed associated with it, with regard to which the clock speeds of other connected components, the DMA itself and the memory, are independent and asynchronous.
3. The number of components to be connected to a DMA unit, the number of interfaces supported, the clock speeds and the data rates are highly system specific. For this reason, each SOC should ideally have a tailor made DMA, but this causes high implementation and verification expenditure.

SUMMARY OF THE INVENTION

In one aspect, an embodiment of the present invention creates an efficient concept for providing, for accepting or for transmitting data.

An embodiment of the present invention is based on the finding that an efficient access to a memory can be achieved by providing a memory element having a variable access rate, particularly in the case of different access rates of the components accessing the memory.

This provides, for example, an interconnect scheme in which, for example, to each master interface and to each slave interface, a separate clock frequency can be allocated which best meets the external interface requirements with regard to performance, wherein each master can simultaneously communicate with each slave with little latency and with a high throughput. The interconnect scheme, for example, a crossbar, does not therefore need to be newly designed when the clock speeds of the entities connected are changed. Since, for example, a single memory allocated to the master can serve a plurality of slaves operating at different clock rates, the area needed for implementing the interconnect screen can be reduced, according to the invention, so that the arrangement can be implemented with all connected components on a single chip.

According to a first embodiment, the present invention creates a memory system with a selection element for selecting a selectable access rate from a plurality of access rates. The task of the selection element is, for example, the selection of a time base (e.g., of a clock signal) or of two time bases for establishing the access rate and of a data path so that data can be transmitted with the selected access rate. The second access rate is necessary when master and slave wish to transfer data at different access rates. The memory system also comprises a memory element for providing or for accepting data at the selectable access rate which has been selected by the selection element. The access can be, for example, a memory access or a read access. According to the invention, the access rate is the rate of storing (or writing) into the memory element or of reading from the memory element or at which the memory element accepts or provides data. In this arrangement, the access rates can be different for the write operation and for the read operation. The result is that several and different communication units which are operated, for example, at different clock rates can access the same memory element without previous and complex clock conversion being necessary. This makes it possible that, for example, a master with a single memory element can operate a plurality of slaves operated at different clock rates, which, for example, access the memory element at different access rates. This reduces the number of memories because there is no need for providing a memory for each slave.

To select the selectable access rates from the plurality of access rates, the memory system comprises, for example, a selection element which can generate a control signal which indicates the selected access rate. The memory element is provided, for example, for receiving the control signal generated by the selection element and, responding to the control signal, for providing or accepting the data at the selectable (selected) access rate. For this purpose, the memory element can detect the selected access rate by means of the control signal in order to determine which access rate from the plurality of access rates is indicated.

The memory element preferably comprises a memory area in which the data can be stored in a freely addressable manner. To provide the data from the memory area or for writing the data into the memory area at variable access rates, the memory element can address the memory area, for example, at the selected access rate. If the accessing process is a read operation, the data can occur at variable access rates, for example, by changing the speed of addressing the memory area by means of a read pointer. This correspondingly applies to a write process in which, in order to enable different storage rates, the write pointer can address the memory area at different rates. The memory element can thus be arranged for controlling the rate at which an address pointer (write or read pointer) addresses the memory area.

According to one embodiment, the memory element can accept the data at a further selectable write access rate which differs from the selectable read access rate, and provide the data at the selectable read access rate. The memory element can be arranged for addressing the memory area for writing at the further selectable write access rate which can differ from the selectable read access rate and for addressing the memory area for reading out at the selectable read access rate.

For selecting the selectable read access rate or, respectively, the further selectable write access rate, the memory system can provide a table in which a plurality of possible access rates is deposited. The access rates in question are often known a priori during the design of an integrated circuit. For example, the selection element selects from a plurality of access rates the selected access rate at which the data are to be provided (or to be stored) (slave side). In the table, or in another table, a plurality of further access rates can be deposited, for example. The selection element then selects, for example, the further selectable access rate (master side) from the table or from the further table. The table or the further table, respectively, can be deposited, for example, in a memory which, e.g., enables the table contents to be changed dynamically at run time.

According to a further embodiment, the selection element can select, for example, a further selectable access rate from the plurality (or from the further plurality, respectively) of access rates for causing the memory element to accept or provide the data at the selectable access rate at a first time and for accepting or providing the data or further data at the further selectable access rate at a further time.

The access rate presently to be used (e.g., the selectable access rate) depends on the access rate with which a processing unit (e.g., a master or a slave) accesses or wishes to access the memory element. According to one embodiment, the memory comprises an identification element which identifies a processing unit which can access the memory element or which identifies the access rate of the processing unit which can access the memory element and optionally the access type (storing or reading-out). The identification element preferably generates an identification signal which points to the processing unit and/or to the access rate and optionally to the access type. The selection element is preferably provided for selecting, in response to the identification signal, the selectable access rate which is allocated to the processing unit or which corresponds to the access rate of the processing unit. The selection element can optionally also detect the access type and forward this information to the memory element. The memory element then allocates the selectable access rate to the respective access type.

According to a further embodiment, the memory system comprises a first processing facility which accesses the memory element at the selectable access rate, and a second processing facility which accesses the memory element at the further selectable access rate. According to the invention, the selection element selects the selectable access rate from the plurality of access rates when the first processing facility accesses the memory element. If, in contrast, the second processing facility accesses the memory element, the selection element selects the further selectable access rate from a plurality of access rates or from a further plurality of access rates. The first processing facility can be, for example, a master and the second processing facility can be, for example, a slave. In this case, e.g., the master can access, with the selectable access rate which is indicated to the memory element, the memory element which accepts the data from the master at the selectable access rate. In contrast, the second processing unit, configured as slave, can access the data at the further access rate which is also indicated to the memory element and read the data out of the memory at the further access rate. The slave processing units can be, for example, components of the main memory. Similarly, however, they can provide interfaces to other components in the overall system such as, for example, hard disc controllers, network interfaces or bus interfaces.

According to one embodiment, the first processing facility and the second processing facility are coupled to the memory element by a crossbar structure and via it access the memory element. In general, the memory system according to the invention comprises a plurality of processing units which are coupled to the memory element by a crossbar structure and which access the memory element at different access rates. For example, the memory system comprises a plurality of slave units which communicate with a single master unit by using the memory element (buffer).

According to a further embodiment, the memory system according to the invention comprises a number of master units and a number of slave units which access the respective memory elements allocated to the respective master unit via a crossbar structure. According to one embodiment, a memory element is allocated to exactly one master unit and serves the number of slaves at, for example, different access rates. According to a further embodiment, a memory element can serve both a number of master units and a number of slave units at different access rates.

According to a further embodiment, an arbiter is provided which controls the access to the memory element (or to the slave processing unit) or, respectively, to the memory elements (or slave processing units) in the memory system according to an embodiment of the invention. The control can be effected, for example, by timing control, by priority control etc.

According to a further embodiment, the invention creates a method for storing in which a selectable access rate is selected from a plurality of access rates and in which the data are provided or accepted at the selected access rate. According to further embodiments, the steps of the method according to an embodiment of the invention are the direct result from the functionality of the memory system according to an embodiment of the invention.

According to a further embodiment, the invention creates a device for storing with a facility for selecting a selectable access rate from a plurality of access rates and with a facility for providing or for accepting data at the selectable access rate. The facility for providing or for accepting data can comprise, for example, a memory area in which the data can be stored, wherein the facility for providing or for accepting data addresses the memory area at the selectable access rate. According to one embodiment, the device for storing comprises a facility for identifying an entity which can access the memory element. The facility for identifying generates, for example, a signal which points to the entity or to its access rate and optionally to its access type. In response to the identification signal, the facility for selecting selects the selectable access rate which is allocated to the entity or, respectively, to its access rate and optionally to the access type.

According to a further embodiment, the device for storing comprises a first facility for processing which, for example, accesses the facility for providing or for accepting data at the selectable access rate. Furthermore, the device for storing can comprise a second facility for processing which accesses the facility for providing or for accepting data at a further access rate. The facility for selecting selects, for example, the selectable access rate when the first facility for processing accesses the facility for providing or for accepting data. Analogously, the facility for selecting selects the further selectable access rate from the plurality of access rates or from a further plurality of access rates when the second facility for processing accesses the facility for providing or for accepting data.

The functionality of the device storing according to an embodiment of the invention preferably comprises the functionality of the memory system according to the invention. In particular, the functionality of the facility for selecting comprises the functionality of the selection element. In addition, the functionality of the facility for providing or for accepting data comprises the functionality of the memory element. The first and the second facility for processing can be analogously a master or a slave.

An embodiment of the invention also creates a communication system with a first interface for providing first data according to a first data communication protocol with a first protocol converter which converts the first data communication protocol into a system communication protocol. According to an embodiment of the invention, the first protocol converter receives the first data according to the first data communication protocol and provides first data according to the system communication protocol due to the protocol conversion performed. For example, the first protocol converter converts the first data, which are present in accordance with the first data communication protocol, in to the first data which are present in accordance with the system communication protocol.

The communication system also comprises a second interface for receiving the first data according to the system communication protocol or for receiving second data according to a second data communication protocol which, for example, differs from the first data communication protocol, and provides the second data according to the system communication protocol on the basis of the second data according to the second data communication protocol.

The data communication protocols and the system communication protocol can be, for example, known chip communication protocols or interface protocols which are used for controlling the chip communication. In this context, the first data communication protocol, the second data communication protocol and the system communication protocol differ from one another, the system communication protocol representing a common, chip-internal communication protocol. This makes it possible that different entities, the data communication of which is controlled by different data communication protocols, can be connected to the interfaces of the communication system. To each of the interfaces supported by a data communication protocol which differs from the system communication protocol, a protocol converter can be allocated which converts the system communication protocol into the respective data communication protocol and/or conversely.

Thus, for example, a communication unit (for example, a master or a slave), the data communication of which is controlled in accordance with the system communication protocol, can be connected to the second interface. In this case, no further protocol converter is allocated to the second interface because the second interface is provided for providing the first data in accordance with the system communication protocol. However, the second interface can be arranged for providing first data in accordance with a second data communication protocol on the basis of the first data in accordance with the system communication protocol.

For the purpose of conversion, the second interface can comprise a second protocol converter which, for example, converts the second data communication protocol into the system communication protocol or the system communication protocol into the second data communication protocol.

During the protocol conversion, the data to be transmitted are preferably not changed. However, the control information belonging to the respective data transfer can be changed into another format. According to another embodiment, the protocol converters are arranged for generating, on the basis of the data and control information according to the first or the second data communication protocol, for example, a data transfer according to the system communication protocol which comprises the first and second data, respectively, and conversely.

According to a further embodiment, for example, the first protocol converter is operated with a single operating clock so that the first data are received and provided with the same operating clock. The same applies to the second protocol converter. In other words, there is preferably no clock conversion in the protocol conversion so that the input of the respective protocol converter and the output of the respective protocol converter are arranged within the same clock domain.

According to an embodiment of the invention, the change in clock rates can be implemented by using the memory system according to the invention. For this purpose, the communication system preferably comprises a memory system which is allocated to the first or to the second interface. The memory system comprises a selection element for selecting a selectable access rate from a plurality of access rates and a memory element for providing or for accepting data at the selectable access rate.

According to a further embodiment, the communication system comprises a first communication facility which is coupled to the first interface, and a second communication facility which is coupled to the second interface. The memory system which is coupled to the first interface is thus provided for receiving or providing the data allocated to the first communication facility at the access rate (for example, the selectable access rate) allocated to the first communication facility. If, in contrast, the memory system is allocated to the second communication facility and is coupled to it, the second communication facility can access the second interface at its associated access rate.

To adapt the different clock domains, e.g., a memory system having a memory element (buffer) which receives or provides the data at a variable access rate can be allocated to each interface. This simplifies the design of integrated circuits because the different access rates (e.g., the different clock rates of the respective processing units) are converted at the respective interface by using the memory system according to an embodiment of the invention.

According to a further embodiment, the invention creates a device for data communication comprising a first facility for providing first data in accordance with a first data communication protocol with a first facility for converting the first data communication protocol into a system communication protocol, wherein the first facility for converting receives the first data in accordance with the first data communication protocol and provides first data in accordance with the system communication protocol. The device for data communication also comprises a second facility for receiving the first data in accordance with the system communication protocol or for receiving the second data in accordance with a second data communication protocol, and for providing second data in accordance with the system communication protocol on the basis of the second data in accordance with the second data communication protocol.

According to a further embodiment, the facility for data communication comprises a second facility for converting the second data communication protocol into the system communication protocol or for converting the system communication protocol into the second data communication protocol. The first facility for converting and/or the second facility for converting preferably receives the data with the same operating clock and provides these with this operating clock.

According to a further embodiment, the device for data communication comprises a first facility for storing as described above, which is allocated to the first facility for providing.

According to a further embodiment, the facility for data communication comprises a first facility for communicating which is coupled to the first facility for providing, and a second facility for communicating which is coupled to the second facility for receiving.

The functionality of the device for data communication preferably comprises the functionality of the communication system described above.

According to a further embodiment, the first interface and the second interface or, respectively, the first facility for providing and the second facility for receiving are coupled via a crossbar structure. In general, the communication system according to an embodiment of the invention comprises a plurality of interfaces to which in each case one protocol converter can be allocated which are connected via a crossbar architecture. Thus, an entity connected to the respective interface can access an entity connected to another interface, or communicate with it, with the aid of the crossbar structure.

According to a further embodiment, the invention creates a method for data communication in which first data are provided in accordance with a first data communication protocol and in which the first data communication protocol is converted into a system communication protocol. For this purpose, the first data are received in accordance with the first data communication protocol and on their basis, first data are provided in accordance with the system communication protocol. The method also comprises the step of receiving the first data in accordance with the system communication protocol or of receiving second data in accordance with a second data communication protocol, and a step of providing second data in accordance with the system communication protocol on the basis of the second data in accordance with the second data communication protocol. Further embodiments of the method for data communication according to an embodiment of the invention are obtained from the functionality of the communication system according to the invention or, respectively, the facility for data communication according to an embodiment of the invention.

An embodiment of the invention also creates a memory communication system with a memory interface for accessing a memory, with a first interface, with a first access control element for controlling the access to the memory interface via the first interface, with a second interface and with a second access control element for controlling the access to the memory interface or to a further memory interface via the second interface. The memory communication system enables, for example, data to be transferred between processing units at the first or second interface and processing units (for example, memory components) at the first or second memory interface without intervention of a CPU.

The memory can be preferably connected to the memory interface so that processing units which can be connected to the first interface and to the second interface, access the memory via the respective interface. Furthermore, a further interface to which a further memory can be connected can be provided, via which a processing unit accesses the further memory.

The access to the respective memory interface is controlled by using the access control elements. The first and the second access control element preferably have the same functionality. According to a further embodiment, the first and the second access control element are of identical structure. This has the result that it is already possible during the design of a memory communication system with an arbitrary number of interfaces, to access access control elements already designed which, for example, can be allocated virtually by means of "copy and paste" to the interfaces to be added, which reduces design costs. If the memory communication system according to an embodiment of the invention is arranged, for example, as a DMA system, a standard design can be established which is independent of the number of interfaces and of the number of memories connected to the interfaces due to the modular allocation of identical access control elements which can be arranged, for example, as channel controllers or memory controllers.

According to a further embodiment, the memory communication system comprises a first communication facility which is coupled to the first interface, a second communication facility which is coupled to the second interface, and a memory which is coupled to the memory interface. The first and the second access control elements are provided for providing, for example, the address of the memory and/or for providing the address of the respective communication facility so that the respective communication facility can access the memory by using the address. As already mentioned, a plurality of memories can be connected to the communication system according to an embodiment of the invention. For example, a further memory can be connected to the further memory interface already mentioned, wherein it is possible, via the second memory interface which is provided for accessing the further memory, to access the latter from the respective processing unit connected to the respective interface via, for example, the first interface or via a further interface.

According to a further embodiment, the memory communication system comprises an arbiter which controls the access to the memory interface or, respectively, the access to the further memory interface via the first or via the second interface.

According to a further embodiment, a memory element and a selection element are allocated to the arbiter. The selection element corresponds, for example, to the selection element described in conjunction with the memory system described above and is provided for selecting an access rate at which the memory element provides or stores data.

According to a further embodiment, a memory element can be allocated to an access control element. According to a further embodiment, a memory element is allocated to each access control element or to the memory interface or the further memory interface.

According to a further embodiment, the memory elements allocated to the interfaces are arranged for providing or for accepting the data at variable access rates. For this purpose, for example, a selection element which selects an access rate from a plurality of access rates as has been described above is allocated to each memory element. The same also applies to the memory interfaces.

According to a further embodiment, a first protocol converter which converts a first data communication protocol, for example, to a system communication protocol which forms the basis for the communication within the memory communication system is allocated to the first interface.

According to a further embodiment, a second protocol converter which, for example, converts a second data communication protocol to a system communication protocol (or vice versa) can be allocated to the second memory interface. The first and the second protocol converter preferably comprise the structure and the functionality of the protocol converters described above.

According to a further embodiment, the invention creates a device for memory communication with a facility for coupling to a memory for accessing the memory, a first facility for coupling, a first facility for controlling the access to the facility for coupling via the first facility for coupling, a second facility for coupling and a second facility for controlling the access to the facility for coupling or to a further device for coupling via the second device for coupling. The functionality of the device for memory communication comprises the functionality of the memory communication systems described above. In particular, the functionality of the facility for coupling comprises the functionality of the memory interface. The functionality of the first facility for coupling comprises the functionality of the first interface, the functionality of the facility for controlling the access to the facility for coupling via the first facility for coupling comprises the functionality of the first access control element and the functionality of the facility for controlling the access to the facility for coupling or to the further facility for coupling via the second facility for coupling comprises the functionality of the second access control element.

According to a further embodiment, the invention creates a method for producing a memory communication system, with arranging a memory interface, arranging a first interface, arranging a first access control element for controlling the access to the memory interface via the first interface, arranging a second interface, and arranging a second access control element for controlling the access to the memory interface or to a further memory interface via the second interface, wherein the first access control element and the second access control element are identical, wherein the second access control element is generated, e.g., as a copy of the first access control element.

BRIEF DESCRIPTION OF THE DRAWINGS

Further illustrative embodiments of the invention will be described with reference to the figures, in which:

FIG. 2 shows a block diagram of a communication system;
FIG. 8a shows a block diagram of a controller in a memory communication system;
and
FIG. 8b shows a block diagram of a control unit for a memory communication system.

DETAILED DESCRIPTION OF ILLUSTRATIVE EMBODIMENTS

Figure 1A:
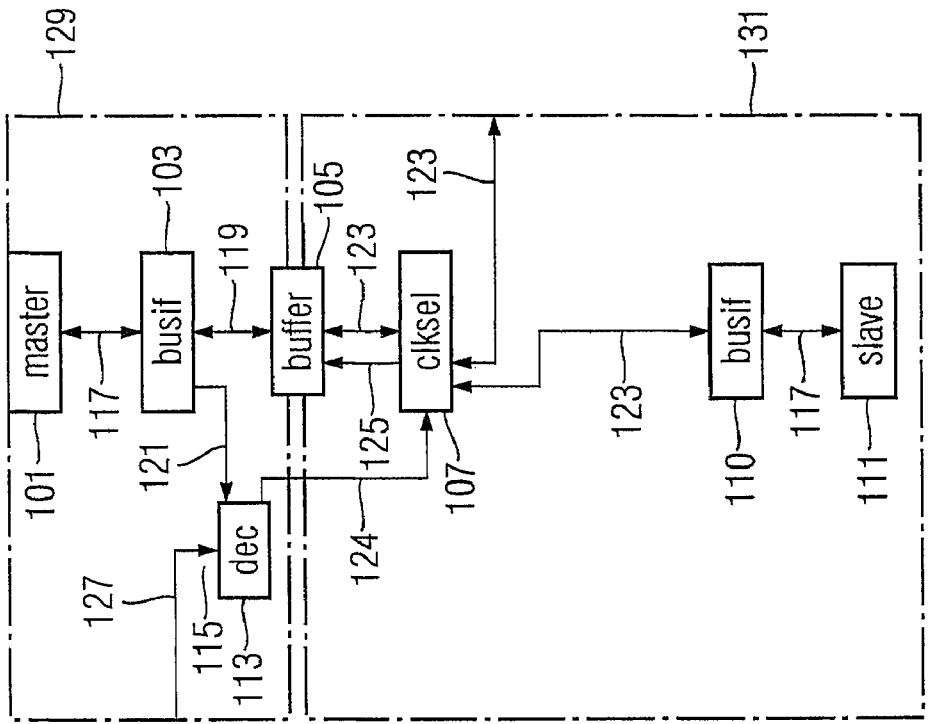
FIG. 1a shows a block diagram of a memory system.

FIG. 1a shows a block diagram of a memory system according to the invention. The memory system comprises a first processing unit 101, an interface 103 (Busif) coupled to the first processing unit 101, a memory element 105 (Buffer) coupled to the interface 103, a selection element 107 (CLKSEL=Clock Select), coupled to the memory element 105, an arbiter 109 coupled to the selection element 107, a further interface 110 coupled to the arbiter 109 and a second processing unit 111 coupled to the further interface 110. The memory system also comprises an identification element 113 which is coupled to the selection element 107. Furthermore, the interface 103 is coupled to the identification element 113 (DEC, decoder). The identification element 113 optionally comprises a further input 115. The selection element 107 optionally has a further input/output 123 for connection to further arbiters. The arbiter 109 optionally has a further input/output 123 for connection to other selection elements.

Figure 1B:
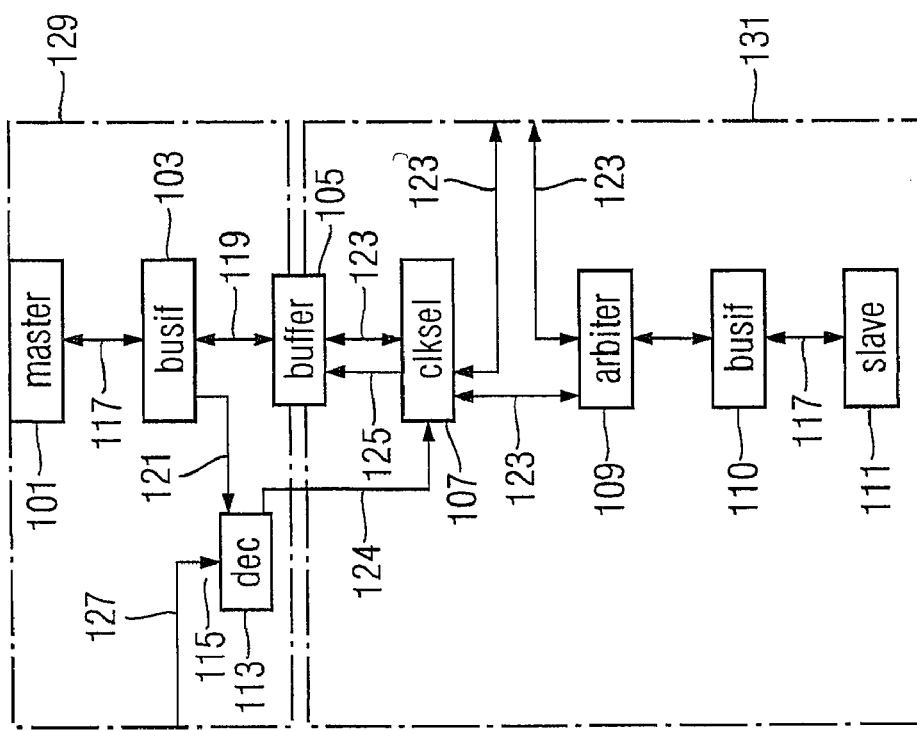
FIG. 1b shows a block diagram of a memory system.

FIG. 1b shows a block diagram of a memory system according to a further embodiment. In contrast to the illustrative embodiment shown in FIG. 1a, the bus interface 110 is coupled to the selection element 107 not via an arbiter but directly.

The connections between the respective elements, shown in FIGS. 1a and 1b, are provided for transmitting the following signals:

Master- or slave-specific bus protocol 117;
M2B (M2B=Master-to-Buffer) interface (transaction code, write and read data) 119;
M2B interface (transaction code) 121;
D2B (D2B=Decoder-to-Buffer) interface (slave selection) 124;
B2S (B2S=Buffer-to-Slave) interface (transaction code, write and read data) 123;
Selected slave clock 125;
Cfg2D (Configuration-to-Decoder) interface (Decoder configuration) 127.

A function of both the M2B interfaces 119, 121 and the B2S interfaces 123 is the provision of transaction codes ((start) address, direction of transfer, type and length of burst, master ID and/or transaction ID), write data and read data and status information (for example, read errors) according to the system communication protocol. Both interfaces are named with various designations in order to make it clear that they do not mandatorily use the same coding of the information even if they fulfil the same function. Possible, generally known representatives of such interfaces are AXI (by ARM Ltd.) or OCP (standardized by VSIA).

A function of the D2B interface 124 is the provision of the identification signals for selecting time base and data path through the selection element. At a minimum, this interface includes the identification of the selected data path (for the case that each data path has its own data transmission rate). If a number of data paths use the data transmission rate, it may be appropriate to provide separate identification of the data path and selected data transmission rate with this interface. From points of view of optimization, other information can also be added, e.g., about the change of the time base.

A function of the Cfg2D interface 127 is the provision of all decision bases needed by the identification element for selecting the data path and the access rate. This includes, for each data path and each selectable access rate, the establishment of the address range, the direction of transfer and optionally additional security information which sets conditions on the allowability of the access such as, for example, the distinction between privileged and non-privileged access, accesses triggered by secure sources, instruction or data accesses. The form in which this information is provided is unimportant. This information is possibly even permanently coded into the identification element.

The first processing unit 101, the interface 103 and the identification element 113 operate within a master clock domain 129, the clock or access rate of which is predetermined by the clock rate of the first processing unit 101 (Master Unit). The selection element 107 (CLKSEL), the arbiter 109 and the second processing unit 111 (slave unit) operate within the slave clock domain 131, within which the clock or access rate is established by the clock rate of the second processing unit 111 (slave unit).

The elements of the memory system are coupled to one another as is shown in FIGS. 1a and 1b. The selection element 107 optionally comprises a further connection 123 which can be connected, for example, to other components which are not shown in FIGS. 1a and 1b, by using a crossbar structure. The arbiter 109 shown in FIG. 1a also optionally comprises a further connection 123 which can be connected to other components, which are not shown in FIG. 1a, for example, by means of a crossbar.

In the text which follows, it is assumed, only by way of example, that the first processing unit 101 is a master unit and that the second processing unit 111 is a slave unit. However, the first processing unit 101 can be a slave unit and the second processing unit 111, in contrast, can be a master unit. A master which triggers transactions is preferably connected to an identification element in order to select the access rate. An identification element can also be allocated to the processing unit 111.

If a number of the memory communication systems shown in FIG. 1a and in FIG. 1b, respectively, are arranged within a communication structure, a communication structure according to the invention is obtained which comprises one or more of the following features:

a number of M master units 101 which are generators of transactions;
a number of S slave units 111 which are consumers of transactions;
a number of M bus interfaces 103 which convert a master communication protocol (data communication protocol) into a transaction code (for example, a system communication code) or, respectively, into a sequence of transaction codes. The bus interfaces 103 can also write data (i.e., from a master to a slave) and read data (i.e., from a slave to a master);

a number of M memory elements 105 (buffer structures), wherein each memory element 105 supports the acceptance of one or more sets of transaction codes, of one or more sets of write data and one or more sets of read data. The memory element 105 is arranged in such a manner that the storing of data (write operation) can be carried out within a clock domain and that the providing of information (read information) can be carried out in another clock domain reliably and without data loss even if the read clocks and the write clocks are independent of one another and/or are asynchronous with respect to one another;

a decision unit 113 for selecting the respective slave unit 111 in dependence on the transaction code with which it is intended to communicate;

a (clock) selection mechanism 107, for example, for adjusting the read-out clock of a transaction code memory and of a write data memory and for adjusting a write clock of the read data memory with respect to the clock of the selected slave unit 111;

a crossbar-like structure which provides for non-blocking simultaneous parallel communication between multiple master units 101 and multiple slave units 111;

an arbitration mechanism 109 for each slave unit, which is provided for resolving conflicts if a number of master units 101 select the same slave unit 111 simultaneously in order to carry out a communication. The arbitration algorithm used by the arbitration mechanism 109 (arbiter) can be either fixed or, for example, partially programmable. A programmable arbitration mechanism allows the latency and the throughput to be adjusted for different master units with regard to the same slave unit in accordance with the application active at a given time;

a number of S further interfaces 110 (slave interfaces) which translate (convert) the transaction codes, the write data and the read data into a communication protocol (data communication protocol) used by the respective slave unit 111;

an exactly defined interface protocol M2B (M2B=Master-to-Bus, 119) which is used between an arbitrary bus interface which is connected to a master, and an arbitrary memory element;

an exactly defined interface protocol B2S (B2S=Bus-to-Slave, 123) which is used between a memory element and an arbiter or a bus interface which is connected to a slave. The same interface protocol is used between an arbiter and a bus interface which is connected to the slave. The arbiters, therefore, use the same protocol at the inputs and at the output which enables an arbiter to be bypassed if it is not intended to arbitrate as is shown, for example, in FIG. 1*b*;

an exactly defined interface protocol D2B (D2B=Decoder-to-Buffer, 124), which is used between an identification element and a memory element;

an exactly defined interface protocol Cfg2D (Cfg2D=Configuration-to-Decoder, 127), for configuring some identification element for establishing how the transaction codes are to be translated to a selection of one of a number of slave units with which it is intended to communicate;

the configuration of the identification element and optionally of the arbiter can be controlled;

a) by devices which are external to the communication structure;

b) by a slave unit which is accessible to at least some master units via the communication structure;

c) some combination of a) and b);

The options listed under b) and c) support the redundancy in the communication structure because a number of equivalent slave units with redundant communication paths can be provided. If a slave unit or if communication paths to a slave unit are found to be non-functioning, the identification elements can be programmed for accessing not this slave unit but an equivalent slave unit via the associated communication paths.

The D2B interface (124) shown in FIGS. 1*a* and 1*b* is provided for crossing the clock domain boundaries. A possible implementation which provides for a synchronization of this signal consists in allowing this information to pass through a memory element which implicitly solves the synchronization problem due to the possibilities of the memory element described above. According to one embodiment, a dedicated synchronization mechanism can also be used.

FIGS. 1*a* and 1*b* also illustrate the structure of the communication system according to the invention which has been described above. The first interface according to the invention, for providing first data according to a first data communication protocol and the first protocol converter according to the invention for converting the data communication protocol into a system communication protocol can be arranged, for example, in the interface 103 (Busif) and/or in the interface 110. In this context, the system communication protocol is the data communication protocol used between the interfaces 103 and 110 in the M2B (119) and B2S (123) forms. The second interface can possibly be arranged with the second protocol converter, for example, within the interface 110 (Busif) or within the interface 103 (Busif). Allocating the first interface and the second interface, respectively, to one of the interfaces 103 and 110 represented in FIGS. 1*a* and 1*b* depends on which functionality (master or slave) is allocated to the respective processing unit 101 and 111, respectively.

According to a further embodiment, FIGS. 1*a* and 1*b* show illustrative embodiments of the device for data transfer according to the invention, the functionality of which comprises the functionality of the memory system described above.

The basic concepts shown in FIGS. 1*a* and 1*b* enable complex systems with a plurality of master and slave units to be assembled and connected. In this context, the minimum min (M, S) of the number of master and slave units limits the number of transactions which can be carried out in parallel and without mutual blocking. Suitable wiring or connection of the units can be implemented with the aid of a crossbar. As shown in FIGS. 1*a* and 1*b*, the clock domain crossing takes place in the memory element 105. This means that the data are stored in the memory element 105 with a first clock rate and are read out of it with a second clock rate which can differ from the first clock rate. The selection element 107 according to an embodiment of the invention (clock selection mechanism) enables all master and slave units to operate within their individual clock domain.

FIG. 2 shows an illustrative embodiment of a more complex communication structure which is based on a scaleable crossbar structure.

The system shown in FIG. 2 comprises a plurality of master units 101 and a plurality of bus interfaces 103, an interface 103 being allocated in each case to one master unit 101. The system also comprises a plurality of identification elements 113 (decoders), a plurality of memory elements 105 and a plurality of selection elements 107. In this arrangement, a memory element 105 and a selection element 107 allocated to the memory element in each case form a memory system with an identification element 113 provided in accordance with a further embodiment.

In the lower area of the illustrative embodiment shown in FIG. 2, further arbiters 109, further interfaces 110 and further second processing units 111 are arranged.

The connections between the elements shown in FIG. 2 are implemented with the aid of a crossbar connection structure. The connections are also provided for transferring the signals discussed already in conjunction with the illustrative embodiments shown in FIGS. 1a and 1b.

If a master unit 101 communicates directly by using the M2B protocol 119, there is no necessity for providing a further bus interface for protocol conversion between the master unit and the memory element (see top right-hand side in FIG. 2). The same applies if a slave unit communicates directly by using the B2S protocol 123 because, in this case, too, there is no necessity for arranging a bus interface for protocol translation (protocol conversion) between the respective arbiter and the respective slave unit (see, e.g., the lower left-hand side in FIG. 2). The arbitration of the number of master units for a slave unit can be carried out by using a single-level arbiter as is shown, for example, in the lower area of FIG. 2. As an alternative, this arbitration can be carried out with a set of cascaded arbiters.

The interfaces of the arrangement shown in FIG. 2 can in each case have a memory element for providing or for receiving data and/or a protocol converter allocated to the respective memory element for providing or for receiving, having the features described above in each case.

According to a further embodiment, the arrangement shown in FIG. 2 shows a block diagram of a device for data communication according to the invention, the functionality of which comprises the functionality of the communication system described above.

The communication structure according to an embodiment of the invention comprises, e.g., one or more of the following features:

low latency of a single memory element (buffer) between a master unit and a slave unit;

a high throughput due to the non-blocking parallel communication through the crossbar;

flexible and independent clock relations between all master and slave units. On the master side, this is implemented due to the property of the memory element (buffer) according to an embodiment of the invention for clock domain crossing and on the slave side it is implemented due to the clock selection mechanism;

data transmission from a master unit to a slave unit and vice versa;

small consumption of area due to the use of only M memory elements (buffers);

reduced implementation requirement due to the reuse of the same basic components for different SOC interconnection structures. This is achieved by using few, suitably defined interface protocols;

reduced verification effort to the reuse of preverified, checked components in different SOCs;

reuse of verification components due to the use of few, suitably defined interface protocols.

A feature of the memory system according to an embodiment of the invention and of the illustrative embodiments shown in FIGS. 1a, 1b and 2 is the selection element 107 (clock selection mechanism) which provides for adaptation to the selected clock domain of the slave unit within a very short time. If a sequence of transactions is transmitted to the same slave unit by the same master unit, the clock selection mechanism is triggered only once in order to further improve the latency.

The feature of adjusting the back-end clock of the memory element (read clock for the transaction code and the write data and the write clock for read data) is the key for enabling the same memory element to be used for all connected slave units. This makes efficient use of the silicon resources which are assigned to the memory elements because a single master unit can communicate at any time with a single slave unit. As a result, a single memory element per master unit and a single memory element within the timing path from the master unit to the slave unit can be provided overall. The first-mentioned effect results in the desired area reduction and the second-mentioned effect keeps down the latency.

The second feature is the composition of arbitrary complex interconnect structures of a few blocks with exactly defined interfaces. This efficiently provides for the flexibility in building up optimized interconnect structures for different SOC designs.

The use of arbiters according to an embodiment of the invention which combine the functions of multiplexing the data paths and of arbitration results in a crossbar structure which is only wired but does not contain any further switching elements. If the function of arbitration is carried out separately from the crossbar switching, a crossbar with switching elements is obtained which implement the function of multiplexing of the data paths. The type of implementation (e.g., by programming, by wiring, by analogue or by digital components) is of no significance to the structures according to an embodiment of the invention. The composition of the complex interconnect structures on the basis of the blocks shown, for example, in FIG. 2 is arranged as shown there.

The structures according to an embodiment of the invention can be implemented in many different ways. The bus interfaces on the master side are optional if the master directly generates the protocol (M2B) to the memory elements. This is the case, for example, if the master directly uses the system communication protocol already mentioned above. The bus interfaces on the slave side are also optional if the respective slave directly uses the protocol (B2S) of the arbiters or of the crossbar as is illustrated, for example, in FIG. 3 (registers and slave). The arbiter for a slave unit is optional if this slave unit is to be accessed by a single master as is illustrated, for example, in FIG. 3. The arbitration algorithm can be either fixed or programmable (see FIG. 3). The decision unit is also optional if a master unit is only intended to communicate with one slave unit as is shown, for example, in FIG. 4. The memory element is optional if the communication between a master unit and a slave unit or slave units takes place at the same clock rate and, for example, should be closely coupled in time. Concerning the handling of the read and write clocks, the memory element can be simplified if the clock rates depend on one another, for example, or have a defined phase relation. This is the case, for example, if the synchronizers (chains of two or more registers according to the prior art) between the read and write pointers are bypassed for a faster update of the status flag related to the buffer filling level.

Figure 3:
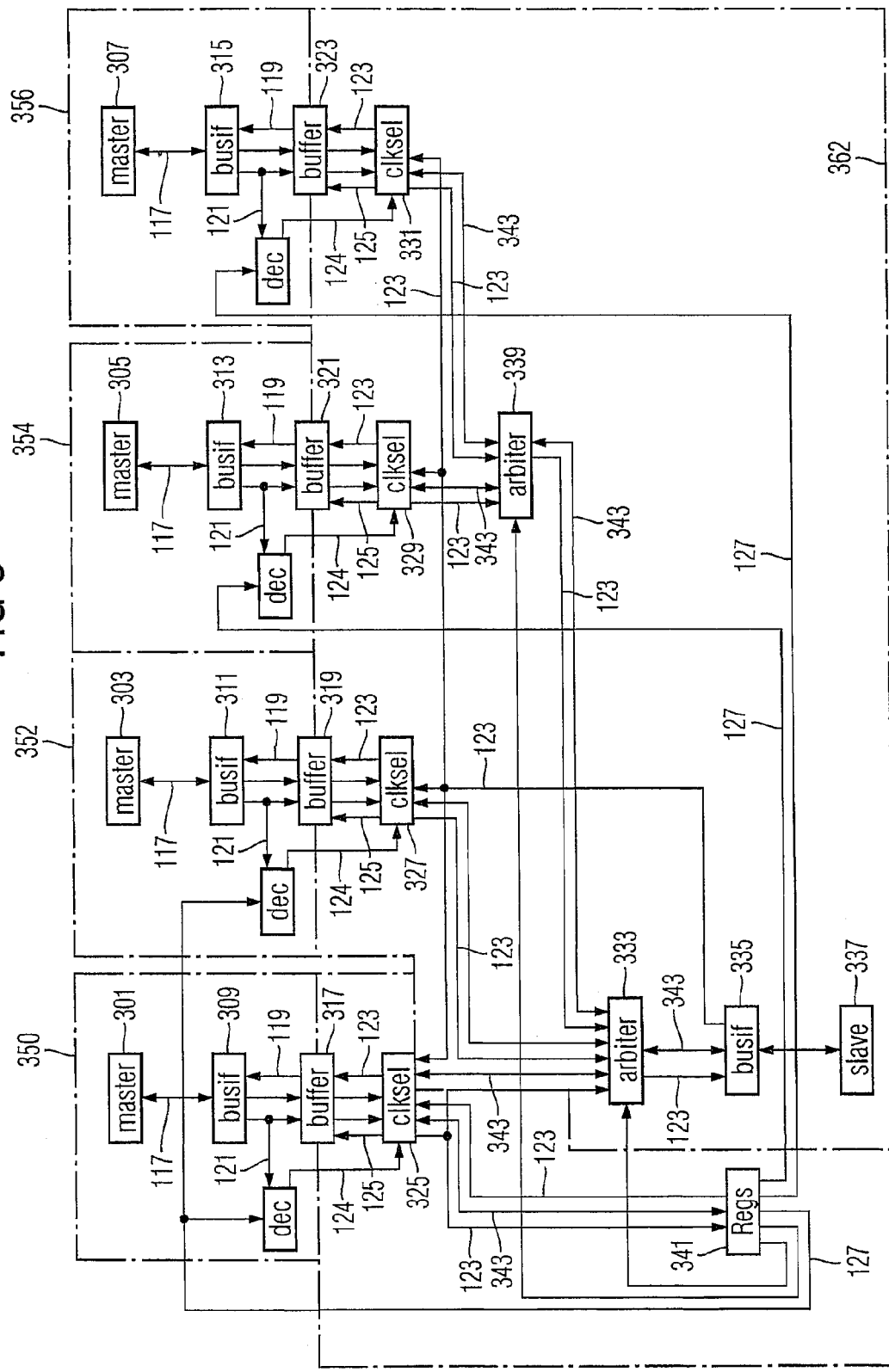
FIG. 3 shows a block diagram of a system comprising the memory system and the communication system.
Figure 4:
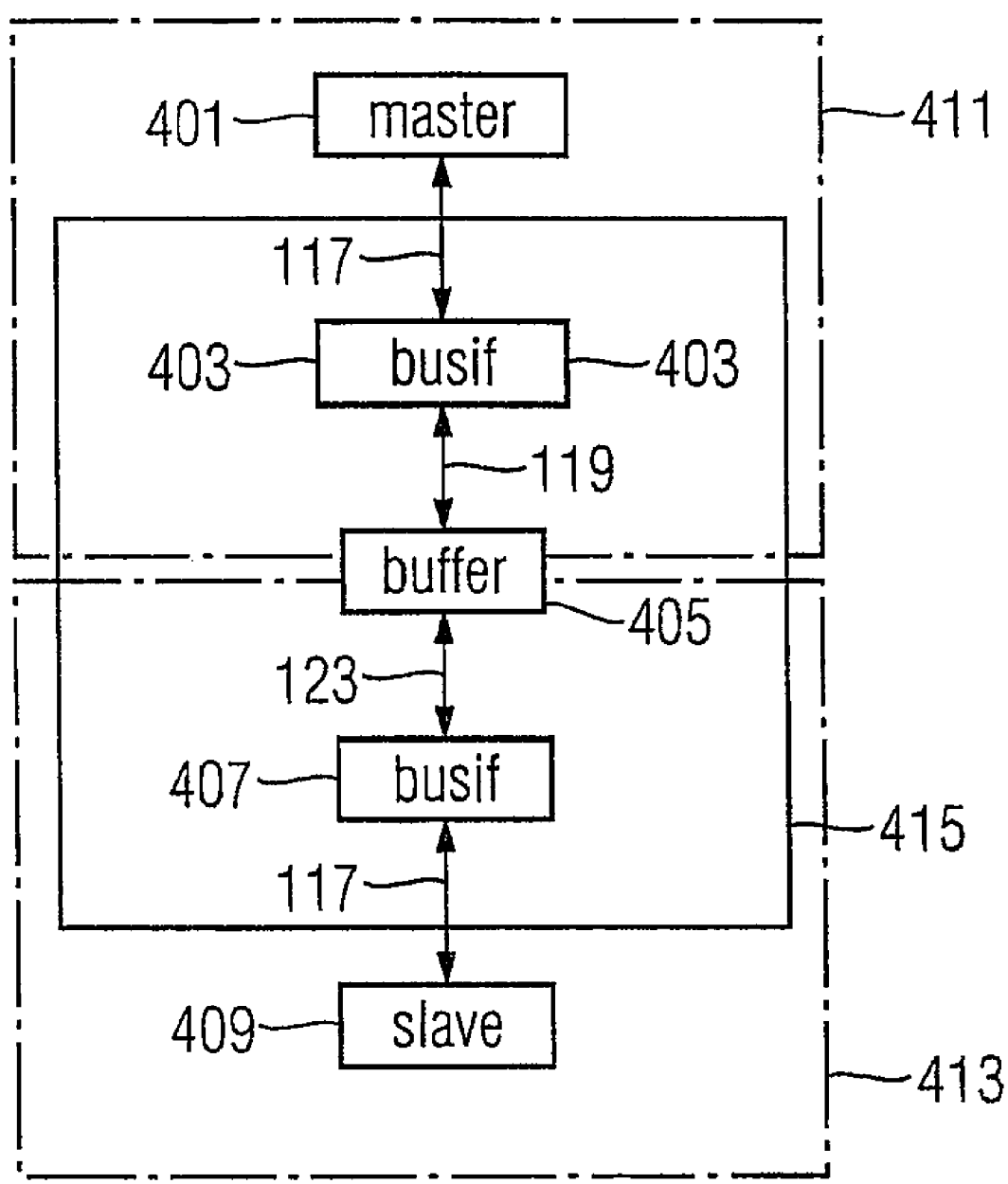
FIG. 4 shows a block diagram of a bus bridge.

The clock selection mechanism is optional if all connected slave units are arranged within the same clock domain as is shown in FIG. 4. The crossbar does not need to be completely connected but can be arranged in a simplified manner depending on which master units are intended to communicate with which slave units and which of these communications are intended to be arranged to be nonblocking (see FIG. 3).

The crossbar can either consist of a horizontal and vertical wiring with switchable elements at the points of intersection, wherein the arbiters, for example, only control the switchable elements. According to a further embodiment, the arbiter can combine the arbitration logic and the controlled switchable elements to form a single module which is similar to a multiplexer. In this case, the remaining areas of the crossbar are only formed by wiring without switching elements. Both implementation variants embody different ways of looking at the same basic concept.

The arbitration does not necessarily need to take place directly opposite to a slave unit which deals with all master units in the same way as is shown, for example, in the lower and middle area in FIG. 2. It is also possible to use a hierarchical arbitration method in which some master units are arbitrated first before a selected master unit is connected to the next arbitration level as is shown, for example, in the lower left-hand and right-hand area in FIG. 2. The number of cascaded arbitration levels and the number of master units which are arbitrated on every level can be selected in accordance with the system requirements. In this case, a number of levels of crossbar wiring and arbitration are produced in a hierarchical interconnect structure as is shown on the bottom left and on the bottom right in FIG. 3.

The number of master units and the number of slave units can be reduced to one which results in a bus bridge which is formed from a subset of the same basic components such as, e.g., a complex SOC interconnect scheme (see FIG. 4).

The memory element can, for example, enable, or not enable, outstanding write transactions to the same slave unit in the sequence. Outstanding transactions are transactions which are not yet concluded even though new transactions have already begun. The memory element can also enable or not enable outstanding read transactions to the same slave unit in the sequence. Furthermore, the memory element can enable or not enable outstanding write transactions (memory transactions) to different slave units in the sequence. From the point of view of the crossbar and/or the arbitration logic, a memory element which is capable of carrying outstanding memory operations to different slave units represents a number of independent master interfaces.

The memory element can allow or not allow, for example, outstanding read transactions to different slave units in a sequence. From the point of view of the crossbar and of the arbitration logic, such a memory element which is capable of carrying out outstanding read operations to different slave units represents itself like a number of independent master interfaces.

The B2S interface 123 for the transaction code and the data to be stored can be, for example, point-to-point oriented or duplicate the transaction code and the outputs of the data to be stored in the clock selection mechanism. According to a further embodiment, the transaction code and the data to be stored can be transmitted by broadcast to all connected arbiters/slave units, only some control signals being transmitted which indicate which connected arbiter/slave is intended to participate in the communication. The B2S interface 123 for the data to be read out can be either point-to-point oriented, wherein the data to be read out are routed back to the clock selection and to the buffer of the master of the present transactions by the arbiters, or the slave units can transmit the data to be read out by broadcast to all connected clock selection mechanisms with an indicator which indicates the master for which the data are intended. It is the task of the clock selection mechanism and of the memory element to pick up the correct read data (see FIG. 3).

The slave units can have the functionality of peripheral elements or memories. The community of the slave units can accept a set of transactions and accept write data or provide the read data in accordance with the transaction to be carried out.

The master units can be arranged as a part of the existing CPUs, MCUs, ASSPs or DSPs. According to a further embodiment, they can be tied to functional components in a chip which carry out particular applications.

In addition, a number of independent memory systems can be implemented on the same chip. These memory systems can be connected via components which are slave units for one memory system and master units for the other memory system.

Arbitrary basic components described above can be divided either into subcomponents or connected to other components at the possible abstraction level (e.g., RTL code, network list, layout etc.). This implies that some new interfaces are produced, for example by dividing components, or that some interfaces disappear due to the combining of components.

FIG. 3 shows a block diagram of a system according to a further embodiment of the present invention. The system comprises the processing units 301, 303, 305 and 307 which are arranged, for example, as master units. The respective master unit 301 to 307 is in each case associated with an interface (Busif) 309 to 315. Each of the interfaces 309 to 315 is in each case connected to one of the memory elements 317 to 323. Each of the memory elements 317 to 323 is coupled to a respective selection element 325 to 331. Furthermore, an arbiter 333 is provided which is coupled to an interface 335 (Busif). The interface 335 is coupled to a processing unit 337 which, for example, is a slave unit. Furthermore, an arbiter 339 and a special slave processing unit 341 (Regs) is provided which mainly contains registers. As shown in FIG. 3, all elements are interconnected.

In addition, some of the connections shown in FIG. 3 are provided for transmitting B2S (B2S=Buffer-to-Slave) transaction and write data control signals 343 (for example, point-to-point). Furthermore, lines are provided for transmitting the D2B (D2B=Decoder-to-Buffer) interface signals 124 (slave select).

FIG. 3 shows an illustrative implementation in which the transaction code and the write data, after clock selection, are transmitted to all connected arbiters and slave units by broadcasting. In a similar manner, the read data are extended by a master ID and transmitted by the slave units directly to the connected clock selection blocks (selection elements) of the masters by broadcasting, wherein the arbiters can be bypassed. The arbitration priorities and the decision criteria can be programmed in the register block 341 (regs). In the implementation shown, register 341 is connected as a slave unit to the crossbar which enables the configuration to be carried out with more than one single master.

According to one embodiment of the present invention, the elements shown in FIG. 3 can be arranged within different clock domains. The master unit 301, the interface 309 and the side of the memory element 317 communicating with the interface 309 are arranged, for example, within a first master clock domain 350. The master unit 303, the interface 311 and the side of the memory element 319 communicating with the interface 311 are arranged, for example, within a second master clock domain 352. The master unit 305, the interface 313 and the side of the memory 321 communicating with the interface 313 are arranged, for example, within a third master clock domain 354. The master unit 307, the interface 315 and the side of the memory element 323 communicating with the interface 315 are arranged, for example, within a fourth master clock domain 356. The master clock domains 350 to 356 are distinguished, for example, by different clock rates which are established, for example by the clock rates of the masters 301 to 307. According to one embodiment, some or all of the master clock domains 350 to 356 can have the same clock rate, however. The register 341, the selection element 325 and the side of the memory 317 communicating with the selection element 325 are arranged, for example, within a slave clock domain 360. The remaining elements and the sides of the memory elements 319, 321 and 323 communicating with the selection elements 327, 329 and 331 are arranged, for example, within a second slave clock domain 362. The slave clock domains 360 and 362 are distinguished, for example, by identical or different clock rates at which the respective elements operate.

FIG. 4 shows a bus bridge which represents a simplification of the communication structure. The bus bridge comprises a processing unit 401 (for example, a master unit), which is coupled to an interface 403 (Busif). The interface 403 is coupled to a memory element 405 (buffer). The memory element 405 is coupled to a further bus interface 407 which is connected to a processing unit 409 (for example a slave unit). The master unit 401, the interface 403 allocated to the master unit 401 and the side of the memory element 405 communicating with the interface 403 are arranged within a master clock domain 411 and are operated at the master clock rate. The slave unit 409, the interface 407 and the side of the memory element 405 communicating with the interface 407 are arranged within a slave clock domain 413, in contrast, and operate at the slave clock rate. The bus bridge 415 comprises the interfaces 403 and 407 and the memory element 405.

The interfaces 403 and 407 are, for example, bus interfaces. In FIG. 4, the signals transmitted by the respective connection between the respective components are also identified which have already been discussed in conjunction with the illustrative embodiments shown in FIGS. 1a and 1b.

The systems described above comprise both the features of the memory system according to an embodiment of the invention and the features of the communication system according to an embodiment of the invention in order to illustrate a common effect of both systems, particularly in the case of crossbar connections. However, both the memory system and the communication system can be used independently of one another and can be connected, for example, to a crossbar interconnect structure.

An embodiment of the invention also creates a memory communication system which can be arranged, for example, as a DMA facility. In particular, an embodiment of the present invention creates a modular memory communication system which can form a modular DMA architecture of preverified components in correspondence with the requirements of each SOC. According to one embodiment, the memory communication system according to an embodiment of the invention supports one or more of the following functions:

1. Memory-to-peripheral copy, peripheral-to-memory copy, memory-to-memory copy and peripheral-to-peripheral copy;

2. A configurable number of interfaces for connecting components which need a DMA capability. Such physical interfaces are designated by the term "port";

3. Ports common to a number of components and/or dedicated to each component. With common ports, the concept of the so-called channels becomes important: a channel is the way of describing the source and the destination of the copying operation from the perspective of a programmer. Each component can have its own channel even with common ports. From the view of the programmer each component can carry out data copying operations independently, wherein, with a common port, a certain arbitration scheme is necessary for serially arranging the accesses which are requested for the same port at the same time;

4. Jointly used/dedicated channels for each component;

5. The functionalities listed at 2. and 3. imply the number of components which are to be connected to a central DMA unit is configurable. This configuration can be independent of the number of ports (with common ports) and channels (with common channels);

6. A configurable arbitration with common ports and/or channels—particularly in the case of one port or a number of ports to the memory. This allows the programming of Quality of Service requirements for different mixtures of active applications on the same SOC;

7. Different types of slave interface protocols at every port;

8. Different clock frequencies, which are not dependent on one another, at every port;

9. Different memory sizes for each port and/or channel in order to allow an adaptation to the different data rate requirements for each component and memory;

10. More than a single port to a memory if the SOC itself has a number of independent memories and an increase in the data throughput is required.

According to an embodiment of the invention, a DMA architecture is used which is essentially based on the same components and interfaces which are used for building up a communication structure. For this reason, only a few DMA-specific components must be newly designed.

Figure 5:
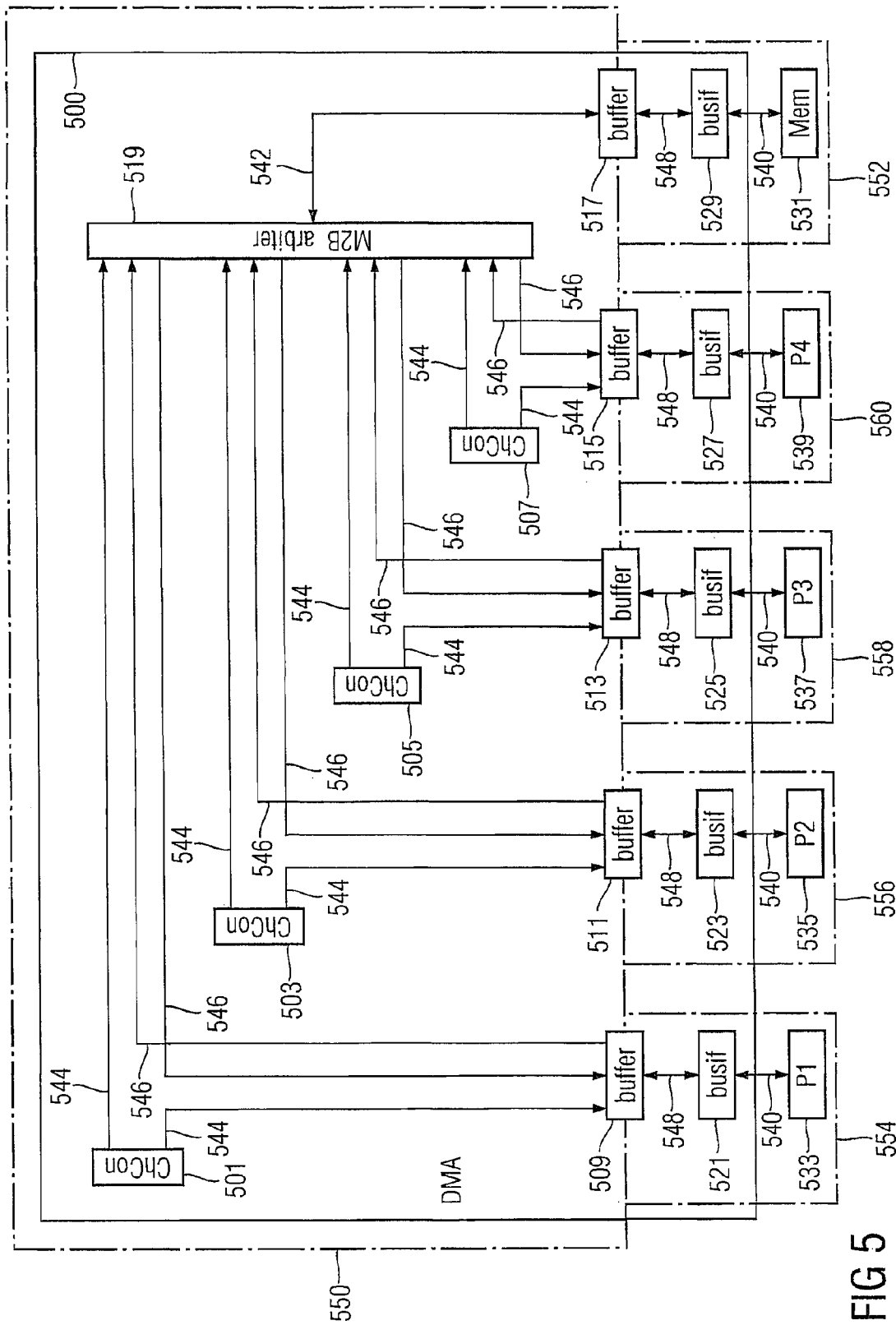
FIG. 5 shows a memory communication system.

FIG. 5 shows a block diagram of a memory communication system according 500 according to an embodiment of the invention with a plurality of access control elements 501, 503, 505 and 507. According to one embodiment, the access control elements 501 to 507 (ChCon, Channel Controller) are identically constructed and have the same functionality. The memory communication system also comprises a plurality of memory elements (buffers) 509, 511, 513, 515 and 517. The first memory element 509 is allocated to the first access control element 501. The second memory element 511 is allocated to the second access control element 503. The third memory element 513 is allocated to the third access control element 505 and the fourth memory element 515 is allocated to the fourth access control element 507. Thus, one of the memory elements 509 to 515 is in each case allocated to the respective access control element 501 to 507. The memory communication system also comprises an M2B arbiter 519 which is coupled to the access control elements 501 to 507 and to the memory elements 509 to 515. The M2B arbiter 519 (M2B=master-to-buffer) is also coupled to the memory element 517.

The memory communication system also comprises a plurality of interfaces 521, 523, 525, 527 and 529. The interfaces 521 to 527 are in each case allocated to one of the memory elements 509 to 515 or, respectively, coupled to in each case one of these memory elements. The interface 529 forms a memory interface for accessing a memory 531.

The memory communication system also comprises a plurality of processing units 533, 535, 537 and 539. The processing units are slave units which respond to transactions of the central DMA. The memory communication system 500 forms, for example, the core of a DMA system as shown in FIG. 5. According to one embodiment of the present invention, the processing units 533 to 539 and the memory 531 are components of the memory communication system 500. According to a further embodiment of the present invention, the processing units 533 to 539 and the memory 531 are external elements and not components of the memory communication system.

According to one embodiment of the invention, the memory elements 509 to 517 are of identical construction. According to a further embodiment, their functionality corresponds to the functionality of the memory elements described above. According to one embodiment of the invention, the interfaces 521 to 527 and the memory interface 529 are of identical construction and have a functionality as has already been described in conjunction with the interfaces described above. The M2B arbiter 519 controls the access to the memory 531 via the respective interface 521 to 529 in the manner already described above.

The following signals are transmitted between the elements of the memory communication system shown in FIG. 5:

Master-specific bus protocol 540;
M2B (master-to-buffer) interface 542 (transaction code, read and write data);
M2B interface 544 (transaction code);
M2B interface 546 (read data or write data);
B2S (buffer-to-slave) interface 548 (transaction code, read and write data).

According to one embodiment of the invention, the access control elements 501 to 507, the M2B arbiter 519 and the sides of the memory elements 509 to 517 in each case communicating with the access control elements 501 to 507 and the M2B arbiter 519 are arranged within a DMA clock domain 550. The memory 531, the memory interface 529 and the side of the memory element 517 communicating with the memory interface 529 are arranged in a memory clock domain 552. The first processing unit 533, the first interface 521 and the side of the memory element 509 communicating with the first interface are arranged within a first peripheral clock domain 554. The second processing unit 535, the second interface 523 and the side of the memory element 511 communicating with the second interface 523 are arranged within a second peripheral clock domain 556. The third processing unit 537, the third interface 525 and the side of the memory element 513 communicating with the third interface 525 are arranged within a third peripheral clock domain 558. The fourth processing unit 539, the fourth interface 527 and the side of the memory element 515 communicating with the fourth interface 527 are arranged within a fourth peripheral clock domain 560. According to one embodiment, all clock domains can be different and be distinguished by different clock and access rates, respectively. According to one embodiment of the present invention, the clock conversion can take place by using the memory elements 509 to 517 as has already been described above. In addition, the components shown in FIG. 5 can communicate by using different data communication protocols or interface communication protocols, respectively. The protocol conversion can be handled by the respective interface 521 to 529 (Busif). For this purpose, each of the interfaces 521 to 529 are only one or some of these, respectively, can have a protocol converter which is provided for changing the respective protocols into one another.

The architecture of the memory communication system according to an embodiment of the invention comprises, e.g., one or more of the following features:

a number of P bus interfaces which, as master units, carry out accesses to the slave interfaces of the connected components which need a DMA capability. The bus interfaces can be the same components which are used in the communication structure described. They include the capabilities for protocol conversion;

a number of C memory elements for each channel. Each memory element enables one or a number of sets of transaction codes, one or a number of sets of write data and one or more sets of read data to be accepted. The memory element is constructed in such a manner that the data can be written into one clock domain and reliably read out in another clock domain without data losses occurring, even if the read and write clocks are independent of one another and asynchronous with respect to one another. The memory elements can be the same components which are used in the memory system described;

a number of M bus interfaces which, as master units, carry out accesses to the slave units of the memories (on-chip or off-chip). The bus interfaces can be the same components which are used in the communication structure described. They include the capabilities for protocol conversion;

a number of M memory elements for each memory port. Each memory element enables one or more sets of transaction codes, one or more sets of write data and one or more sets of read data to be accepted. The memory element is constructed in such a manner that data can be written in, in one clock domain and reliably read out in another clock domain without data losses occurring even if the read and write clocks are independent of one another and asynchronous with respect to one another. The memory elements can be the same components which are used in the memory system described;

a number of M arbiters (which, for example, can be adapted for the DMA if the M2B protocol differs from the B2S protocol so that the adapted arbiter uses the M2B protocol at inputs and outputs) and which carry out the arbitration of some or all of the transactions, of the writing and reading of data in the connected memory buffer;

a number of C channel controllers (access control elements) which, at the same time, operate as a master for a channel buffer and a memory arbiter (and therefore memory element), one memory element receives a read transaction, the other one receives a write transaction. The data ports of the connected memory elements are crossed so that the read data of one memory element are fed as write data into the other memory element and conversely;

a number of M identification elements can be optionally provided in order to select the port with which it is intended to communicate, in dependence on the transaction code which can be of significance, for example, in the case of a peripheral-to-peripheral copy. The identification elements can be the same components which are used in the memory system described;

a clock selection mechanism (selection element) can be optionally provided in order to carry out the adjustment of the read clock of the transaction code buffer and of the write data buffer and to carry out the adjustment of the write clocks of the read data buffer with respect to the clock for selected port code which can be of significance, for example, for a peripheral-to-peripheral copy. The selection element can be the same component which is used in the memory system described;

a crossbar-like structure (as in the memory system) which simultaneously allows a non-blocking parallel communication between a number of masters and a number of slaves;

optionally, a number of P+M arbitration mechanisms for each port for resolving conflicts if a number of transactions are intended to simultaneously use the same port for carrying out a communication. This is advantageous for a memory-to-memory copy by using a single memory port for providing a single port for a number of channels, and with a number of memory port arbiters which are in competition with regard to the same port in peripheral-to-peripheral copy. The arbitration algorithm can be fixed or at least partially programmable. A programmable arbitration mechanism allows the latency and a throughput to be adjusted for different channels to the same port in accordance with the application active at a given time. The arbiters can be the same components which are used in the memory system described since in this case the B2S protocol is also used at the input and output;

a defined interface protocol M2B (as in the memory system) which can be used between a channel controller and a memory port arbiter and between a memory port arbiter and a memory element and between a channel controller and a memory element;

a defined interface protocol B2S (as in the crossbar) which can be used between a memory element and an arbiter or a bus interface which is connected to a slave unit. The same interface protocol can be used between an arbiter and a bus interface which is connected to a slave unit. The arbiters therefore use the same protocol at their inputs and their outputs which enables the arbiter to be bypassed if it is not intended to arbitrate (see, e.g., FIG. 1b);

a defined interface protocol D2B (as in the memory system) which can be used between an identification element and a memory element;

a defined interface protocol Cfg2D (as in the memory system) in order to configure an identification element for establishing how the selection of a slave from a plurality of slaves is to be made from the transaction codes;

the configuration of the channel controllers, of the identification elements and optionally of the arbiters can be controlled by:

a) a DMA-internal memory (registers and a type of descriptor memory) for configuring the operation of the channel controllers which can be configured into an on-chip communication structure by a CPU via a slave interface;

b) one or more state machines which autonomously call up the necessary configuration data from the memory and initialize the components of the DMA;

c) wired configuration adjustments;

d) some combination of a), b) and c).

In the configuration shown, the structure shown in FIG. 5 is capable of carrying out a memory-to-peripheral copying transaction and a peripheral-to-memory copying transaction.

According to an illustrative embodiment, the peripheral processing units 533, 535, 537 and 539 (P1, P2, P3, P4) and the memory 531 (MEM) are connected to the central memory communication system 500 (DMA) as slave units. The access control elements 501, 503, 505, 507 (channel controller, ChCon) operate as master units with two transaction interfaces. The DMA 500 comprises separate memory elements 509 to 515 for each peripheral channel and a common buffer 517 for the memory 552. The respective channel controller 501 to 507 ensures the execution of a read (write) transaction to the respective connected peripheral memory element and a write (read) transaction to the common temporary storage element 529 which results in a peripheral-to-memory or, respectively, memory-to-peripheral copy. The M2B arbiter 519 which is arranged before the memory element 517 enables the access to be prioritized if a number of transactions can be carried out at the same time. This extends the functionality of the DMA clock domain 550 according to an embodiment of the invention in order to meet Quality-of-Service requirements.

The modular central DMA unit 500 according to an embodiment of the invention comprises one or more of the following characteristics:

support of all types of copying operations;

support of all types of slave bus interfaces (reuse of the interfaces of the communication structure);

support of one or more memory interfaces;

support of an arbitrary number of ports;

support of an arbitrary number of channels per port;

support of an arbitrary number of peripheral components which are connected to a port, wherein the number of peripheral components is only limited by the characteristics of the bus;

support of common and/or dedicated ports;

support of common and/or dedicated channels;

configurable memory sizes for each channel and port;

configurable arbitration priorities and a fair arbitration scheme as already described for the memory system;

flexible independent clock relations between all ports and between all peripheral components and memories, respectively;

configurable quality-of-service due to the arbitration configurability;

a trade-off between area requirement and throughput can always be achieved because the crossbar-like structure enables a number of independent data paths to be provided (parallel access to independent memories, peripheral-to-peripheral copy operations which are carried out in parallel with memory-to-peripheral copying operations, etc.);

reduced implementation effort due to reuse of the same basic components such as, e.g., the memory system and by reusing the same components for different SOC DMA structures which is possible due to the few defined interface protocols;

reduced verification effort due to the reuse of preverified tested components in different SOCs;

reuse of verification components due to the small number of defined interface protocols.

One feature of the memory communication system according to an embodiment of the invention is the access control element (channel controller) which operates simultaneously with two M2B interfaces. The channel controller is therefore capable of providing both the source address and the destination address and the transaction codes. The channel controller also provides for a data exchange between arbitrary components by means of a cross connection of the read and write data paths of two connected memory elements (buffers).

The M2B arbiter uses the M2B protocol instead of the B2S protocol of the memory system. If both protocols are of similar configuration, a slight adaptation must be provided for this purpose. The M2B protocol and the B2S protocol may be any protocols which support or control, respectively, a data communication between a master and a buffer (M2B) and a buffer and a slave (B2S), respectively. The same applies to the other protocols which have been mentioned above.

The memory communication system according to an embodiment of the invention can be built up, for example, by using the crossbar interconnect structure, with the DMA-specific components described above, with regard to the further functionality on the basis of pre-existing and verified components of the communication structure. Furthermore, different complex DMA structures can be assembled.

Figure 6:
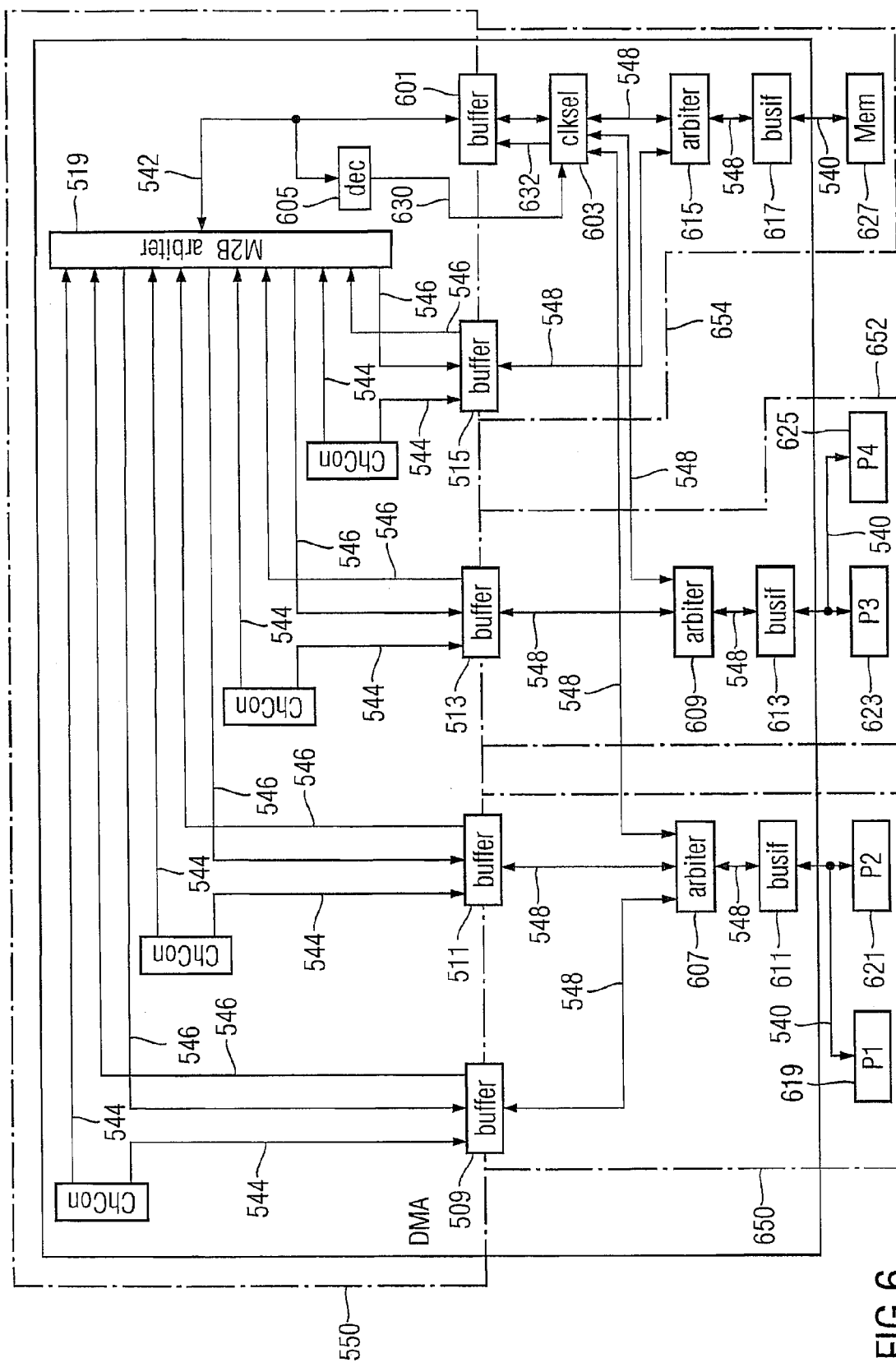
FIG. 6 shows a memory communication system.

FIG. 6 shows a block diagram of a memory communication system according to an embodiment of the invention which represents an extension of a DMA functionality for arbitrary types of copying operations.

In contrast to the illustrative embodiment shown in FIG. 5, the communication system shown in FIG. 6 comprises a memory system with a memory element 601 (buffer) and a selection element 603 (CLKSEL). Furthermore, an identification element 605 (decoder) is provided. The memory communication system also comprises a first arbiter 607 which is coupled to the memory elements 509, 511 and the selection element 603, and a second arbiter 609 which is coupled to the memory element 513 and the selection element 603. The first arbiter 607 is coupled to a first interface 611. The second arbiter 609 is coupled to a second interface 613. Furthermore, a third arbiter 615 is provided which is coupled to the memory element 515 and the selection element 603. A third interface 617 is allocated to the third arbiter 615.

A first processing unit 619 (P1) and a second processing unit 621 (P2) are coupled to the first interface 611. A third processing unit 623 (P3) and a fourth processing unit 625 (P4) are coupled to the second interface 613. Furthermore, a memory 627 is coupled to the interface 617 (memory interface).

According to one embodiment, the processing elements 619 to 625 and the memory 627 are elements of the memory communication system. According to another embodiment, these elements are external and can be connected to the memory communication system.

The processing elements 619 to 625 and the memory 627 can be configured, for example, as slave units or as master units.

The components shown in FIG. 6 can be connected, for example, by using a crossbar, wherein the signals already described in connection with the illustrative embodiment shown in FIG. 5 are exchanged between the individual elements. In addition, a D2B interface signal 630 (decoder-to-buffer, slave select) is transmitted from the identification element 605 to the selection element 603. The memory element 601 also receives a signal 632 (selected slave clock) which indicates the selected slave clock.

As shown in FIG. 6, the processing units 619 and 621 and the elements allocated to these processing units are arranged, for example, within a peripheral clock domain 650. The processing units 623 and 625 and the elements allocated to these units are arranged, for example, within a second peripheral clock domain 652. The memory 627 and the elements allocated to the memory 627 are arranged, for example, within a memory clock domain 654. The clock domains can be distinguished by different or by identical clock and access rates, respectively.

According to one embodiment, the memory elements 509 to 515 are simplifications of the memory systems described above, with in each case exactly one access rate in the DMA clock domain and one access rate in the peripheral clock domain by means of which the clock conversion is implemented. According to a further embodiment, one selection element with a hard-wired D2B interface can be allocated in each case to the memory elements 509 to 515 in order to implement the clock conversion. The memory elements 509 to 515 and the memory element 601 comprise the functionality of the memory elements described above. The selection element 603 comprises the functionality of the selection elements described above. According to one embodiment, the interfaces 611, 613 and 617 can be provided for performing a protocol conversion. According to one embodiment, one protocol converter can be allocated in each case to the interfaces 611, 613 and 617 as is described above. These protocol converters comprise the functionality, described above, of a protocol converter. According to one embodiment, the interfaces themselves can in each case have a protocol converter for carrying out the protocol conversion described above.

The memory communication system shown in FIG. 6 supports the memory-to-memory copying operations and the peripheral-to-peripheral operations and is obtained, for example, by extending the memory communication system shown in FIG. 5.

Adding further (e.g., peripheral) memory elements to the memory communication system makes it possible to support the feature of memory-to-memory copying. Adding a clock selection mechanism and an identification element in addition to the common memory element and the arbiter between the bus interface and the memory of each peripheral channel makes it possible to reuse the common memory element for carrying out a peripheral-to-peripheral copying operation.

The memory-to-memory copying operation operates as follows: the channel controller 507 supplies the source and destination addresses and the transactions. The arbiter 615 arranged opposite the memory interface 617 is configured in such a manner that a read operation has as higher priority than a write operation. The read operation from the memory 627 is therefore the first transaction to be carried out, as a result of which the read buffer of the memory element 601 which is allocated to the memory interface 617 is filled. The data are then transferred via the M2B arbiter 519 to the memory element 515, allocated to the channel controller 507, in the write buffer. The latter happens as soon as the memory-to-memory copying operation is the operation with the highest priority to be carried out which, for example, is dependent on the Quality of Service set at the M2B arbiter.

As soon as both the memory element 515 and the memory element 601 are filled, no further read transactions are carried out and the write transaction wins the arbitration. It shifts the data from the memory element 515 to the destination address in the memory (in the memory communication system), as a result of which first the memory element 515 and then the memory element 601 are emptied. As soon as a further burst can be carried out for refilling the memory element 601, the next read operation will again win the arbitration. In this manner, the DMA 600 switches between memory read and write operations by using a single port to the memory 627.

Peripheral-to-peripheral copying operations make use of the identification element 605 and the clock selection element 603 which are shown in FIG. 6. Instead of the memory address, an address which is located in the peripheral address space is programmed in one of the access control elements. The data are called up from the peripheral via the bus interface and from the peripheral memory elements. If the Quality-of-Service arbitration allows, the data are transferred to the write buffer of the memory element 601 with the address of the peripheral destination element in the transaction code. The selection element 603 selects the data path to one of the arbiters 607 or 609 depending on the input from the identification element 605. The clock selection mechanism switches into the clock domain of the peripheral destination components and the data are transferred to the peripheral destination component via the arbiter and the bus interface of the appropriate port.

It is possible to implement a number of channels per peripheral DMA port with separate buffers in a simple manner if the connected bus to the peripheral elements is capable of serving a number of slave units. For this purpose, for example, the arbiter can be extended in order to select between a number of channel buffers and the common buffer so that the same port can be used for communicating with a plurality of peripheral components. For example, the processing units 619 (P1) and 621 (P2) shown in FIG. 6 are connected to the same DMA port. This reduces the number of external interfaces of the DMA and the wiring of the on-chip buses.

A number of peripheral components sharing the same channel make use of the capabilities of the peripheral bus: for example, the same channel controller accesses the processing units 623 (P3) and 625 (P4) shown in FIG. 6. Depending on the address of the transaction code, either the peripheral unit P3 or P4 is accessed via the bus, the respective peripheral unit P3 or P4 participating in the communication. The accesses must therefore be programmed in a suitable and useable order because no Quality-of-Service arbitration is possible within the same channel.

To extend the memory communication system shown in FIG. 6, it is even possible to introduce a number of common buffers as a result of which a number of transactions can take place simultaneously (e.g., peripheral-to-peripheral copy and peripheral-to-memory copy). This is possible because the basic components are provided for a non-blocking crossbar which, in the present case is, for example, an integral part of the DMA as is shown, for example, in FIG. 7.

Figure 7:
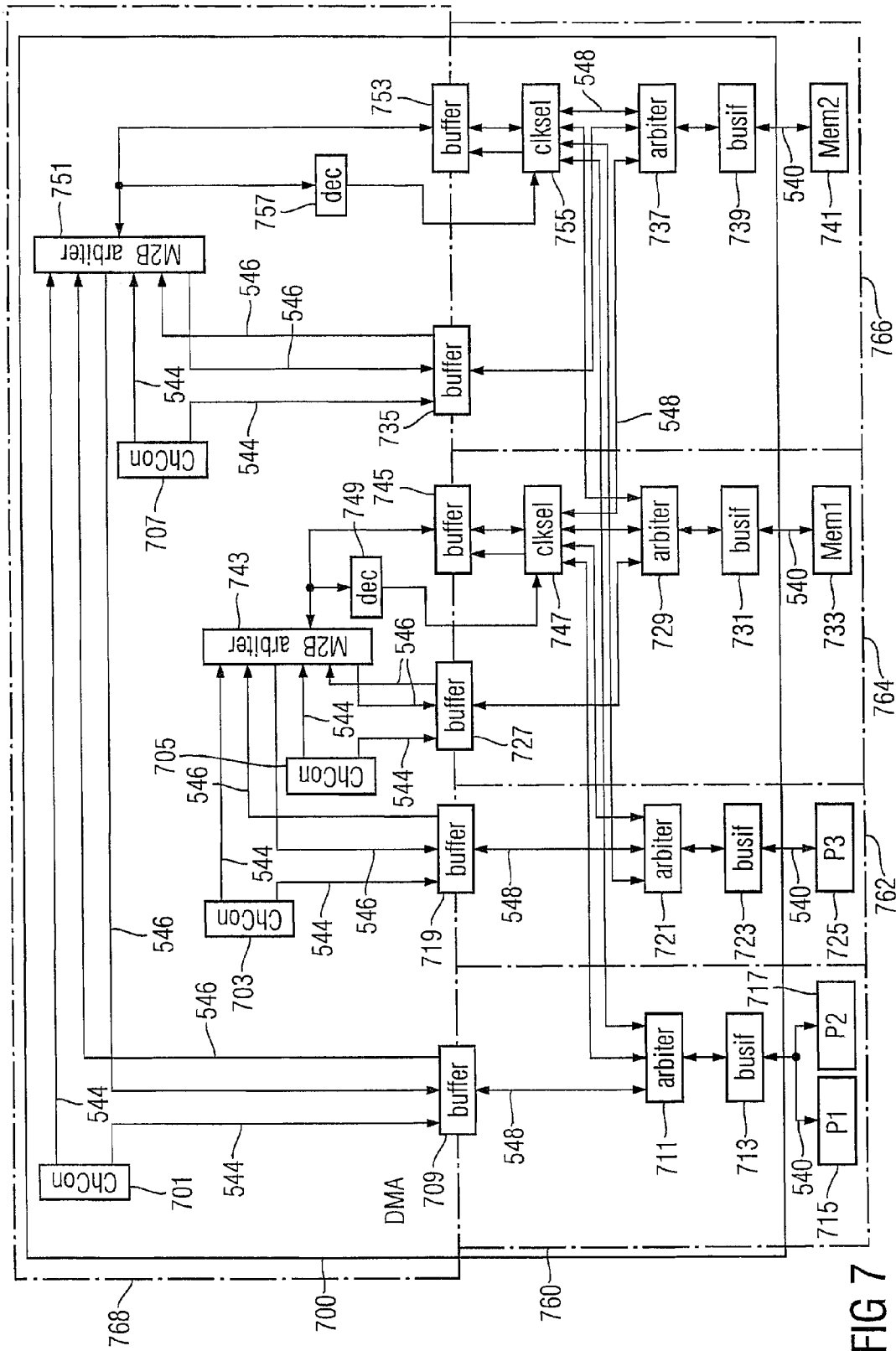
FIG. 7 shows a memory communication system.

FIG. 7 shows a memory communication system 700 with the access control elements (channel controller, ChCon) 701, 703, 705 and 707. A first memory element 709 which is coupled to an arbiter 711 is allocated to the first access control element 701. The arbiter 711 is coupled to a first interface 713. The first interface 713 is coupled, for example, to a first processing unit 715 and to a second processing unit 717 via an interface port.

A second memory element 719 which is coupled to a second arbiter 721 is allocated to the second access control element 703. The second arbiter 721 is coupled to a third processing unit 725 via a second interface 723 and possibly via a further interface port.

A third memory element 727 which is coupled to a third arbiter 729 is allocated to the third access control element 705. The third arbiter 729 is coupled to a first memory 733 via a third interface 731 (memory interface) via, for example, a memory port. A fourth memory element 735 which is coupled to a fourth arbiter 737 is allocated to the fourth access control element 707. The fourth arbiter 737 is coupled to a second memory 741 via a fourth interface 739.

The second and the third access control elements 703, 705 are coupled via an arbiter 743 to a memory system comprising a memory element 745, a selection element 747 and an identification element 749. The identification element 749 is also coupled to the selection element 747.

The fourth access control element is coupled via an arbiter 751 (B2S arbiter) to a further memory system which has a memory element 753, a selection element 755 (CLKSEL) and an identification element 757 (which, for example, comprises the functionality of the identification element according to the invention).

The structure shown in FIG. 6 illustrates the extension of the structure from FIG. 5 by using a number of common memory elements, as a result of which several transactions can take place simultaneously (e.g., peripheral-to-peripheral copy and peripheral-to-memory copy). This is possible because the components according to the invention are generated, for example, for a non-blocking crossbar which is an integral part of the memory communication system (DMA) in the present case.

The processing units 715, 717 and 725 (P1, P2, P3) are slave units. According to one embodiment, the memory elements shown in FIG. 7 comprise the functionality of the memory elements described above. According to a further embodiment, a selection element (e.g., CLKSEL) can be allocated in each case to one or more of the memory elements 709, 719, 727, 745, 735, 753 as has been described above. According to one embodiment, the interfaces (Busif) 713, 723, 731 and 739 comprise the functionality of the interfaces described above and, for example, are also arranged for performing a protocol conversion. For this purpose, a protocol converter can be allocated in each case to one or more interfaces. According to a further embodiment, one or more interfaces comprise a protocol converter as has been described above.

The processing units 715, 717 and 725 and the memories 733 and 741 can be connected to the memory communication system 700 via a port. These elements can either be components of the memory communication system 700 or components external thereto.

The processing facilities 715 and 717 and the components allocated to these processing facilities are arranged, for example, within a first peripheral clock domain 760. The processing facility 725 and the components allocated to this processing facility (e.g., interface 723, arbiter 721 and the side of the memory 719 communicating with the arbiter 721) are arranged, for example, within a second peripheral clock domain 762. The memory 733 and the components allocated to this memory are arranged, for example, within a first memory clock domain 764. The memory 741 and the components allocated to this memory are arranged, for example, within a second clock memory clock domain 766. These clock domains differ, for example, due to different clock or access rates. The channel controllers 701, 703, 705, 707 and the components allocated to these channel controllers and the sides of the memory elements 709, 719, 727, 745, 735 and 753 communicating with these channel controllers are arranged, for example, within a DMA clock domain 768.

The memory structures according to the invention can be constructed, for example, on the basis of known memory elements such as, e.g., flip-flops, latches or micro-SRAMs. The crossbar-like connecting patterns can have, for example, a plurality of parallel wirings.

The structure of a DMA having a number of common buffers and interfaces is particularly advantageous in the case of memory systems with a crossbar and a number of memories as slave units. The DMA unit can then access, for example, a number of memories in a non-blocking manner or carry out a memory-to-memory copy between different memories by means of the parallel, non-blocking access to two memories simultaneously instead of by switching between reading and writing in the same memory.

Using these components provides each of the DMA implementations described above with the possibility of operating each port within a separate clock domain and operating the memory with a clock from another clock domain again.

If the memory access itself takes place via a memory system which is constructed of the same components, the memory port of the memory communication system does not need a bus interface. It can be connected directly to the memory system by using the B2S protocol after the arbiter.

The memory communication system according to an embodiment of the invention (DMA system) can be implemented in one or more of the ways described in the text which follows:

a) the memory interfaces on the respective memory side are optional if the memory operates directly by using the B2S protocol;

b) the bus interfaces at the peripheral port are optional if the peripheral units operate directly with the B2S protocol;

c) the arbiter for a peripheral port is optional if it is not intended to support either a peripheral-to-peripheral copy or a memory-to-memory copy with a number of memory interfaces (see FIG. 5);

e) the arbitration algorithm can be fixed or programmable;

f) the decision component (the identification element) is optional if neither a peripheral-to-peripheral copy nor a number of memory interfaces have to be supported (see FIG. 1);

g) the memory element at the peripheral ports is optional if the communication between the DMA and one or more peripheral units is carried out by using the same clock and should be closely coupled in time;

h) the memory element can be simplified with regard to the handling of the read and write clocks if it is known that the clocks are dependent on one another and have a defined (previously known) phase relation. The simplification can be implemented, for example, by bypassing the synchronizer between the read and write pointers for a fast update of the status flags related to the memory fill state;

i) the clock selection mechanism (e.g., the selection element) is optional if all connected ports operate within the same clock domain;

j) the arbitration does not need to be carried out directly before a bus interface of a port which treats the competing channels equally. A hierarchical arbitration method can be used just as well in that some channels are first arbitrated before the selected channels are connected to the next arbitration level. The number of cascaded arbitration levels and the number of channels which are arbitrated on each level can be selected in agreement with the system requirements;

k) the memory element can provide for, for example, outstanding write actions to the same peripheral units or memories in the sequence;

l) the memory element can provide for, for example, outstanding read actions to the same peripheral unit (processing unit) or to the same memory in the sequence;

m) the memory element can allow, for example, outstanding write transactions to different peripheral units or memories in the sequence or prevent these;

n) the memory element can allow, for example, outstanding read transactions to different peripheral units or memories in the sequence or prevent these;

o) the B2S interface for a transaction code and write data can either be point-to-point oriented, wherein the transaction code and the write data outputs are duplicated in the clock selection mechanism, or wherein the transaction code and the write data are transmitted, for example, by broadcasting to connected arbiters of the bus interfaces, wherein only a few point-to-point control signals remain which indicate which connected arbiter/which connected bus interface is to participate in the communication;

p) the M2B interface for the read data can either be point-to-point oriented, wherein the read data are routed back to the channel buffer via the M2B arbiter, or wherein the memory buffer can transmit the read data to all connected channel buffers, for example, by broadcasting, and only a few point-to-point signals are left for determining which channel buffer is to participate in the data transfer;

q) the configuration of the transactions which are generated by the channel controller, the arbitration algorithm and priorities and the destination selection criteria of the identification element can be carried out from a) a set of configuration registers which are programmable by a CPU, b) hard-coded constants, c) a control logic which is either hard-coded or can be programmed by a CPU, d) a control logic which reads the configuration data autonomously out of the memory or d) a combination of all methods mentioned above;

r) a number of independent structures can be implemented on the same chip;

s) any one of the basic components described above can be divided into subcomponents or combined with other components which can be carried out, for example, on any level of abstraction (RTL code, network list, layout etc.). This implies that a few new interfaces are produced, for example, due to the dividing of components, or that some interfaces disappear, for example, due to the combining of components. As long as the same functionality is implemented, this is in each case another way of implementing the communication structure according to an embodiment of the invention.

FIGS. 8a and 8b show block diagrams of DMA control arrangements (DMA control logic).

The DMA control arrangement shown in FIG. 8a comprises an interface 801, a descriptor memory 803 coupled to the interface 801, a configuration register 805 coupled to the interface 801, an arbiter 807 coupled to the configuration register (CfgRegs) and an M2B arbiter 809 coupled to the configuration register 805. The DMA control unit also comprises a first access control element 811 (channel controller, ChCon) and a second access control element 813 (channel controller, ChCon). Furthermore, an identification element 815 is coupled to the configuration register 805.

The arbiter can be arranged, for example, within a peripheral clock domain 817. The remaining elements can be arranged, for example, within a DMA clock domain 819. The clock or access rates within the respective clock domain can be identical or different.

The DMA control unit also comprises a status register 821 (CTRL & Status) which is coupled to the bus interface 801, to the descriptor memory 803 and to the configuration register 805.

The DMA control unit shown in FIG. 8b also comprises a third control element 823 which is coupled to the status register 821, to the descriptor memory 803 and to the M2B arbiter 809.

The interface 801 comprises, for example, the functionality of the interfaces described above and, for example, a protocol converter for protocol conversion. According to one embodiment, a protocol converter can be allocated to the bus interface 801. The DMA control units shown in FIGS. 8a and 8b can be used for controlling the functionality of the memory communication system according to the invention.

The implementation shown in FIG. 8a illustrates an architecture in which the DMA (memory communication system) can be connected to an on-chip bus so that programming by a CPU is possible. FIG. 8b illustrates an extended structure in which the DMA itself is capable of carrying out the descriptor update from the memory if, for example, a channel runs out of descriptors.

As shown in FIG. 8a, the interface 801 (bus interface) of the CPU provides for access to the entire descriptor memory 803 (DescrMem) to the configuration register 805 or, respectively, to a plurality of configuration registers which the DMA control unit can have, for an arbitration algorithm, for the priority settings and for the configuration of the identification element 815. For example, the descriptor memory 803 can comprise a single descriptor memory for each channel identification element 815 or a complete list of entries which are executed in a sequence. A completion information item is sequentially transferred from the channel identification elements 815 to the descriptor memory 803 after the operations with respect to a single descriptor entry have been completed. The descriptor memory 803 signals to the control logic (status register 821) if there are no further descriptors for a channel. In this case, the control logic 821 generates an interrupt signal (IRQ) and transfers it to a CPU, and as a result an update of the descriptors is requested. The identification element and arbiter configurations can be implemented on the basis of static signals which, for example, are stored in the configuration register block 805. Due to its pseudo-statistical nature, crossing the clock domains from, for example, the DMA clock domain 819 to the peripheral clock domain 817 by the arbitration configuration signals does not present any problems. According to one embodiment, these signals are not allowed to change clock domain as long as a DMA channel is active.

The structure shown in FIG. 8b differs from the illustrative embodiment of FIG. 8a by a type of updating of the descriptor memory 803. Instead of a direct CPU intervention, the control logic (control register) uses the dedicated channel controller 823 for reading new descriptors out of the memory when a channel runs out of the descriptors. For this reason, the descriptor memory 803 uses the M2B interface as if it were a memory element. The same identification elements can therefore be used. Between the elements shown in FIGS. 8a and 8b, the following signals are also transmitted:

Cfg2D interface signal (interface, decoder configuration) 830;
Configuration of the arbitration algorithm 832;
Interrupt connections (IRQ) 834;
Channel operation completed 836;
Channel operation descriptor 838;
Configuration of the arbitration algorithm 840.

The system communication protocols, the data communication protocols and the interface protocols, respectively, can be known on-chip protocols or on-chip bus protocols, respectively, as, e.g., AHB, AXI or OCP (Open Core Interconnect). According to one embodiment, it is thus possible to use components from different manufacturers which use different protocols.

What is claimed is:

1. A memory system comprising:
a memory element for transferring data between a first processing element and a second processing element, wherein the memory element is configured for providing data to or for accepting data from the first processing element at a first access rate and for providing data to or accepting data from the second processing element at a second access rate; and
a selection element for adjusting at least one of the first access rate and the second access rate;
an identification element coupled to the to the selection element, the identification element configured to generate an identification signal that indicates an access rate of an identified processing element, wherein the selection element is arranged for selecting a further first access rate or a further second access rate depending on whether the identification signal has a first logic value or a second logic value, wherein the memory element, selection element, and identification elements together form a first modular hardware element; and
a second modular hardware element coupled to the second processing element and to a third processing element and to the first processing element, wherein
the second modular hardware element has an identical function as the first modular hardware element, and
the second modular hardware element is disposed on a same integrated circuit as the first modular hardware element.

2. The memory system according to claim 1, wherein the memory element comprises a memory area in which the data can be stored in a freely addressable manner, and wherein the memory element is arranged for addressing the memory area at the first access rate.

3. The memory system according to claim 1, wherein selection element selects the first access rate from a plurality of access rates stored in a table.

4. The memory system according to claim 1, wherein the memory element is arranged for accepting or providing the data at the first access rate at a first time and for providing or accepting the data or for providing or accepting further data at the second access rate at a further time.

5. The memory system according to claim 1, wherein the selection element is arranged for selecting the first access rate when the first processing element accesses the memory element, or for selecting the second access rate when the second processing element accesses the memory element.

6. The memory system according to claim 1, further comprising a crossbar interconnect structure coupled to the memory element.

7. The memory system according to claim 1, wherein the memory element is coupled between a first interface and a first access control element.

8. A device comprising:
an identifying device identifying at least one of a first processing element and a second processing element, the identifying device comprising a signal generating device generating an identification signal based on an access rate of an identified processing element;
a rate selection device selecting a first access rate or a second access rate depending on whether the identification signal has a first logic value or a second logic value;
a data transfer device transferring data between the first processing element and the second processing element;
a first data access device providing data to or accepting data from the first processing element at the first access rate;
a second data access device providing data to or accepting data from the second processing element at the second access rate;
a rate adjusting device adjusting at least one of the first access rate and the second access rate, wherein the first and second data access devices, the rate selection device, and the identifying device together form a first modular hardware element; and
a second modular hardware element coupled to a third processing element, wherein
the second modular hardware element has an identical function as the first modular hardware element, and
the second modular hardware element is disposed on a same integrated circuit as the first modular hardware element.

9. A communication system comprising:
an identification element for identifying an element at a first or second interface, the identification element producing an identification signal according to the identified element and a clock rate of the identified element;
the first interface for providing first data according to a first data communication protocol, wherein the first interface has a first protocol converter for converting the first data communication protocol into a system communication protocol, wherein the first protocol converter is arranged for receiving the first data in accordance with the first data communication protocol and providing the first data in accordance with the system communication protocol;
the second interface for receiving the first data in accordance with the system communication protocol or for receiving second data in accordance with a second data communication protocol and for providing second data in accordance with the system communication protocol on the basis of the second data in accordance with the second data communication protocol;
a memory element is arranged between the first interface and the second interface, the memory element configured to
transfer data between the first interface and the second interface,
provide data to or for accept data from the first interface at a first clock rate,
provide data to or for accept data from the second interface at a second clock rate;

a selection element for selecting the first clock rate or the second clock rate depending on whether the identification signal is in a first or second state, wherein the identification element, memory element, and selection elements together form a first modular hardware element; and a second modular hardware element coupled to the second interface and to a third interface, wherein
the second modular hardware element has an identical function as the first modular hardware element, and
the second modular hardware element is disposed on a same integrated circuit as the first modular hardware element.

10. The communication system according to claim 9, wherein the second interface is arranged for providing the first data in accordance with the second data communication protocol on the basis of the first data in accordance with the system communication protocol, or for providing the first data in accordance with the system communication protocol.

11. The communication system according to claim 9, wherein the second interface comprises a second protocol converter for converting the second data communication protocol into the system communication protocol or for converting the system communication protocol into the second data communication protocol.

12. The communication system according to claim 9, wherein the first protocol converter is arranged for receiving and providing the first data with a same operating clock.

13. A device for data communication, the device comprising:
a first facility for providing first data in accordance with a first data communication protocol, the first facility comprising a first protocol converter for converting the first data communication protocol into a system communication protocol, wherein the first protocol converter is arranged for receiving the first data in accordance with the first data communication protocol and providing the first data in accordance with the system communication protocol;
a second facility for receiving the first data in accordance with the system communication protocol or for receiving second data in accordance with a second data communication protocol and for providing second data in accordance with the system communication protocol on the basis of the second data in accordance with the second data communication protocol;
a memory element is arranged between the first facility and the second facility, the memory element configured to transfer data between the first facility and the second facility,
provide data to or for accept data from the first facility at a first clock rate,
provide data to or for accept data from the second facility at a second clock rate;
an identification element for producing an identification signal according to an access rate of an identified facility, wherein the identification signal has a first logic value or a second logic value;
a selection element for adjusting at least one of the first clock rate when the identification signal has the first logic value and the second clock rate when the identification signal has the second logic value, wherein the first clock rate is asynchronous with respect to the second clock rate, wherein the identification element, memory element, and selection elements together form a first modular hardware element; and a second modular hardware element coupled to the second facility and to a third facility, wherein
the second modular hardware element has an identical function as the first modular hardware element, and
the second modular hardware element is disposed on a same integrated circuit as the first modular hardware element.

14. A method for communicating, the method comprising:
providing first data at a first data rate in accordance with a first data communication protocol, wherein, in the step of providing the first data at the first data rate in accordance with the first data communication protocol, the first data communication protocol is converted into a system communication protocol, wherein the first data are received in accordance with the first data communication protocol and wherein first data in accordance with the system communication protocol are provided on the basis of the first data in accordance with the first data communication protocol;
receiving the first data at the first data rate in accordance with the system communication protocol or receiving second data in accordance with a second data communication protocol and providing second data at a second data rate in accordance with the system communication protocol on the basis of the second data in accordance with the second data communication protocol;
identifying an element providing the first or second data to produce an identification signal;
selecting the first data rate or the second data rate depending on whether the identification signal is in a first or second state, wherein the steps of providing first data, providing second data, identifying and selecting are performed using a first modular hardware element; and
providing third data and the second data to a second modular hardware element having an identical function as the first modular hardware element, the second modular hardware element being disposed on a same integrated circuit as the first modular hardware element.

15. A memory communication system, comprising:
a memory interface for accessing a memory;
a first interface;
a first access control element for controlling access to the memory interface via the first interface, the first access control element connected between the memory interface and the first interface;
a second interface;
a second access control element for controlling the access to the memory interface or to a further memory interface via the second interface, the second access control element connected between the memory interface and the second interface;
an identification element for producing an identification signal according to an identified element and a corresponding access rate, wherein the identification signal has a first logic value or a second logic value;
a memory system allocated to the first interface or to the second interface or to the memory interface, the memory system comprising
a selection element for selecting a first clock rate when the identification signal has the first logic value, and a second clock rate when the identification signal has the second logic value, and
a memory element for providing or for accepting data at the first clock rate, wherein the memory element, and the selection element together form a first modular hardware element; and a second modular hardware element coupled to the second interface and to a third interface, wherein
the second modular hardware element has an identical function as the first modular hardware element, and
the second modular hardware element is disposed on a same integrated circuit as the first modular hardware element.

16. The memory communication system according to claim 15, wherein the first access control element and the second access control element are identical.

17. The memory communication system according to claim 15, further comprising:
a first communication facility which is coupled to the first interface;
a second communication facility, which is coupled to the second interface; and
a memory which is coupled to the memory interface, wherein the first access control element and the second access control element are provided for providing an address of the memory.

18. The memory communication system according to claim 15, further comprising an arbiter provided for controlling the access to the memory interface or to the further memory interface via the first interface or via the second interface.

19. The memory communication system according to claim 15, further comprising a first protocol converter for converting a first data communication protocol into a system communication protocol allocated to the first interface, and a second protocol converter for converting the system communication protocol into a second data communication protocol or for converting a second data communication protocol into the system communication protocol allocated to the second interface.

20. A direct memory access (DMA) system including a controller and comprising a DMA clock domain, the DMA system comprising:
an interface configured to be coupled to a bus;
a descriptor memory coupled to the interface;
a configuration register coupled to the interface;
an arbiter interface coupled to the configuration register, the arbiter interface configured to be coupled to an arbiter in a peripheral clock domain, the peripheral clock domain different from the DMA clock domain, wherein the peripheral clock domain operates at a different clock rate from the DMA clock domain;
a first access control element coupled to the descriptor memory, the first access control element controlling access from a first channel to a first memory at a first clock rate;
a second access control element coupled to the descriptor memory, the second access control element controlling access from a second channel to the first memory or a second memory at a second clock rate, the second clock rate different from the first clock rate;
an identification element coupled to the configuration register, the identification element generating an identification signal based on an identified channel and a corresponding clock rate; and
a status register coupled to the interface, the descriptor memory, and the configuration register, wherein the DMA controller selects the first channel and the first clock rate if the identification signal has a first logic value, or the second channel and the second clock rate if the identification signal has a second logic value, wherein the first and second clock rates are selectable during operation of the DMA controller.

21. The DMA controller of claim 20, further comprising a master-to-buffer (M2B) arbiter coupled to the configuration register.

22. The DMA controller of claim 20, wherein the interface comprises a protocol converter.

23. The DMA controller of claim 20, further comprising a dedicated channel controller coupled to the status register, the dedicated channel controller reading new descriptors out of a memory when a channel runs out of descriptors.

* * * * *